US012775760B1

(12) United States Patent
Li et al.

(10) Patent No.: US 12,775,760 B1
(45) Date of Patent: Oct. 27, 2026

(54) FRAMEWORK FOR LOG RECONSTRUCTION AND INTERPRETATION USING LATENT REPRESENTATIONS AND PARAMETERIZED PHYSICAL MODELS

(71) Applicant: Halliburton Energy Services, Inc., Houston, TX (US)

(72) Inventors: Bei Li, Singapore (SG); Xusong Wang, Singapore (SG); Ning Tu, Singapore (SG); Wael Soliman Mohamed Elhawary, Katy, TX (US); Weijun Guo, Houston, TX (US); Wei Zhang, Katy, TX (US); Sriram Srinivasan, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 19/317,105

(22) Filed: Sep. 2, 2025

(51) Int. Cl.
*G06F 7/48* (2006.01)
*G06F 30/28* (2020.01)

(52) U.S. Cl.
CPC .................................... *G06F 30/28* (2020.01)

(58) Field of Classification Search
CPC ....................................................... G06F 30/28
See application file for complete search history.

(56) References Cited

U.S. PATENT DOCUMENTS 11,828,168 B2 11/2023 AlTammar et al.
2020/0370423 A1 11/2020 Li et al.
2021/0041596 A1* 2/2021 Kushwaha ........... G06N 3/0455
2021/0124087 A1* 4/2021 Liu .......................... G06N 3/09
2023/0032044 A1 2/2023 Li et al.
2024/0169185 A1 5/2024 Batra et al.
2024/0394529 A1 11/2024 Sheng et al.

FOREIGN PATENT DOCUMENTS

WO 2021160980 A1 8/2021
WO 2024112769 A1 5/2024

OTHER PUBLICATIONS

Al-Fakih, Abdulrahman, et al. "Well log data generation and imputation using sequence based generative adversarial networks." Scientific Reports 15.1 (2025): 11000. (Year: 2025).*

International Search Report and Written Opinion, dated May 28, 2026, for the corresponding International Application No. PCT/US2025/045921, 9 pages.

Geng et al. Physics-guided deep learning for predicting geological drilling risk of wellbore instability using seismic attributes data. Engineering Geology. Oct. 9, 2020, vol. 279, No. 105857, pp. 1-11.

* cited by examiner

*Primary Examiner* — Nithya J. Moll
(74) *Attorney, Agent, or Firm* — Straylight LLP

(57) ABSTRACT

Described herein are systems and techniques for reconstructing target well log measurements using machine learning. An example method can include receiving input data comprising one or more input logs; generating, using a machine learning model, a latent representation of the input data; estimating, based on the latent representation, one or more parameters of a reconstruction model associated with at least one target log, wherein the at least one target log corresponds to a log type that is not fully represented in the input data; and generating, using the one or more parameters, a reconstructed version of the at least one target log.

17 Claims, 11 Drawing Sheets

FRAMEWORK FOR LOG RECONSTRUCTION AND INTERPRETATION USING LATENT REPRESENTATIONS AND PARAMETERIZED PHYSICAL MODELS

TECHNICAL FIELD

The present disclosure relates generally to systems and techniques for processing well log data in subsurface environments, and more particularly to machine learning systems configured to reconstruct target log measurements.

BACKGROUND

Well log data is critical for evaluating geologic formations and making decisions during drilling, completion, and production operations. However, logging tools often fail to record complete, continuous, or high-quality measurements due to sensor malfunction, borehole conditions, tool availability, or operational constraints. As a result, many well log datasets contain missing, sparse, or degraded data for one or more log types. Conventional interpolation and curve-fitting techniques offer limited reliability and generalizability, especially in geologically complex intervals or when multiple logs are degraded.

Recent approaches have explored the use of machine learning to impute missing log values based on surrounding context. Some models rely on latent embeddings to reconstruct logs in a purely data-driven manner. Others apply physics-guided techniques that use known relationships between input logs and target outputs. However, these approaches typically operate in isolation and may not fully leverage the complementary strengths of latent modeling and physically grounded parameter inference.

BRIEF DESCRIPTION OF THE DRAWINGS

Illustrative examples and aspects of the present application are described in detail below with reference to the following figures.

DETAILED DESCRIPTION

Figure 1A:
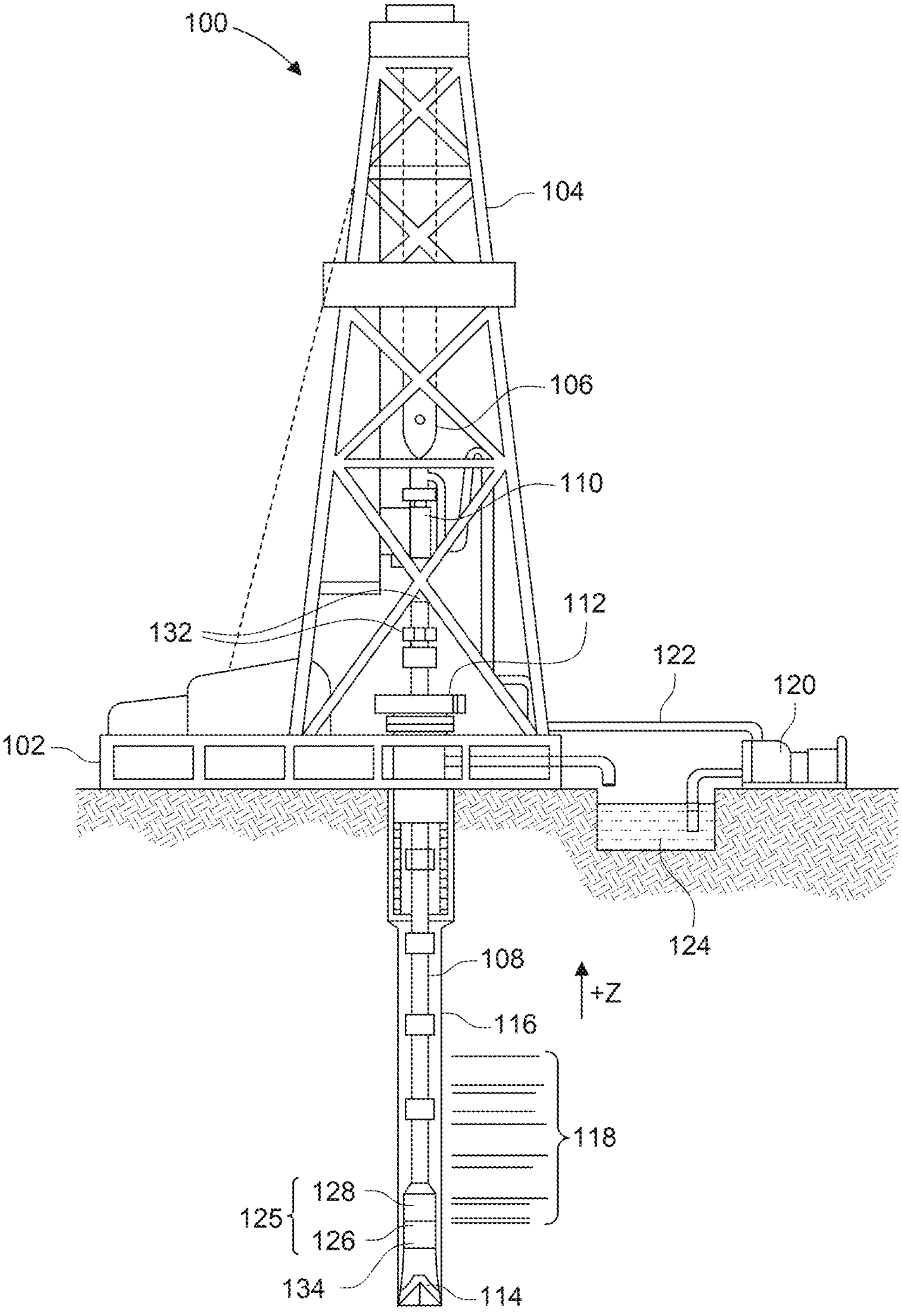
FIG. 1A is a schematic side-view of an example wireline logging environment, according to some examples of the present disclosure.

Various aspects and examples of the disclosure are discussed in detail below. While specific implementations are discussed, it should be understood that this is done for illustration purposes only. A person skilled in the relevant art will recognize that other components and configurations may be used without parting from the spirit and scope of the disclosure. Thus, the following description and drawings are illustrative and are not to be construed as limiting. Numerous specific details are described to provide a thorough understanding of the disclosure. However, in certain instances, well-known or conventional details are not described in order to avoid obscuring the description. References to one embodiment or an embodiment, one aspect or an aspect, or one example or an example in the present disclosure can refer to the same embodiment/example/aspect/etc., or any embodiment/example/aspect/etc., and such references mean at least one of the embodiments, examples, and/or aspects.

Moreover, reference to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Also, various features are described which may be exhibited by some embodiments and not by others.

The terms used in this specification generally have their ordinary meanings in the art, within the context of the disclosure, and in the specific context where each term is used. Alternative language and synonyms may be used for any one or more of the terms discussed herein, and no special significance should be placed upon whether or not a term is elaborated or discussed herein. In some cases, synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any example term. Likewise, the disclosure is not limited to various embodiments given in this specification.

Without intent to limit the scope of the disclosure, examples of instruments, techniques, systems, apparatuses, methods (also referred to as processes herein), non-transitory computer-readable media, and their related results according to the examples and aspects of the present disclosure are given below. Note that titles or subtitles may be used in the examples for convenience of a reader, which in no way should limit the scope of the disclosure. Unless otherwise defined, technical and scientific terms used herein have the meaning as commonly understood by one of ordinary skill in the art to which this disclosure pertains. In the case of conflict, the present document, including definitions will control.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

As previously mentioned, the systems and techniques described herein relate to the reconstruction of target well log data using machine learning. In many logging scenarios, one or more measurements may be missing, degraded, incomplete, or partially unavailable due to tool limitations, operational constraints, or formation-dependent signal quality. These data gaps may result in data gaps across critical log types such as compressional slowness (DTC), shear slowness (DTS), bulk density (RHOB), neutron porosity (NPHI), and resistivity (RT). In some cases, certain measurements may be entirely absent from a given interval, or available only at coarse resolution. Conventional interpolation and empirical correction techniques often fail to generalize across geologic settings, leading to unreliable or oversmoothed reconstructions that can bias petrophysical analysis and downstream modeling.

The systems and methods disclosed herein address this problem by enabling flexible and data-driven reconstruction of target logs using a hybrid machine learning framework. In some aspects, the system generates a latent representation of available input data and estimates parameters of a reconstruction model associated with each target log. The reconstruction model may include a parameterized reconstruction function, such as a predefined petrophysical equation or a multi-step computational workflow governed by one or more tunable parameters. In some examples, the system supports both approaches independently or in combination, allowing the reconstruction method to be selected or tuned based on log type, training history, or performance objectives.

By integrating latent feature encoding with parameter-based reconstruction, the system can capture nonlinear relationships among logs while also enforcing physical constraints where applicable. This architecture enables the reconstruction of missing or unrecorded logs in a manner that is geologically coherent, physically consistent, and robust to tool variability. In some configurations, the system supports per-depth inference, uncertainty estimation, and multi-log reconstruction from partially available data. The machine learning model may be trained using ground truth logs and optimized using loss functions that include both reconstruction loss and physics-based regularization.

In some implementations, the system includes an encoder configured to process a windowed input segment comprising one or more valid logs, a parameter inference module that generates input-dependent model coefficients or latent vectors, and a reconstruction engine that outputs a reconstructed version of the target log. Attention-based set encoders may be used to generate latent features without relying on fixed log ordering or positional embeddings. The system may operate in real time or as part of an offline workflow and may be implemented as a standalone module or integrated into an existing subsurface modeling platform.

Examples of the systems and techniques described herein are illustrated in FIG. 1A through FIG. 10 and described below. In some examples, the disclosed systems may be implemented in connection with oil and gas operations, such as those illustrated in FIGS. 1A and 1B. These environments are presented for illustrative purposes and reflect common applications in which well log data is collected and reconstructed. However, one of ordinary skill in the art will recognize that the systems and techniques described herein may additionally or alternatively be applied in other subsurface evaluation contexts, including geothermal exploration, carbon storage, groundwater modeling, or any domain in which incomplete or degraded log data may be encountered.

FIG. 1A is a schematic diagram of an example logging while drilling wellbore operating environment, according to some examples of the present disclosure. The drilling arrangement shown in FIG. 1A provides an example of a logging-while-drilling (commonly abbreviated as LWD) configuration in a wellbore drilling scenario 100. The LWD configuration can incorporate sensors (e.g., EM sensors, seismic sensors, gravity sensor, image sensors, etc.) that can acquire formation data, such as characteristics of the formation, components of the formation, etc. For example, the drilling arrangement shown in FIG. 1A can be used to gather formation data through an electromagnetic imager tool (not shown) as part of logging the wellbore using the electromagnetic imager tool. The drilling arrangement of FIG. 1A also exemplifies what is referred to as Measurement While Drilling (commonly abbreviated as MWD) which utilizes sensors to acquire data from which the wellbore's path and position in three-dimensional space can be determined. FIG. 1A shows a drilling platform 102 equipped with a derrick 104 that supports a hoist 106 for raising and lowering a drill string 108. The hoist 106 suspends a top drive 110 suitable for rotating and lowering the drill string 108 through a well head 112. A drill bit 114 can be connected to the lower end of the drill string 108. As the drill bit 114 rotates, it creates a wellbore 116 that passes through various subterranean formations 118. A pump 120 circulates drilling fluid through a supply pipe 122 to top drive 110, down through the interior of drill string 108 and out orifices in drill bit 114 into the wellbore. The drilling fluid returns to the surface via the annulus around drill string 108, and into a retention pit 124. The drilling fluid transports cuttings from the wellbore 116 into the retention pit 124 and the drilling fluid's presence in the annulus aids in maintaining the integrity of the wellbore 116. Various materials can be used for drilling fluid, including oil-based fluids and water-based fluids.

Logging tools 126 can be integrated into the bottom-hole assembly 125 near the drill bit 114. As drill bit 114 extends into the wellbore 116 through the formations 118 and as the drill string 108 is pulled out of the wellbore 116, logging tools 126 collect measurements relating to various formation properties as well as the orientation of the tool and various other drilling conditions. The logging tool 126 can be applicable tools for collecting measurements in a drilling scenario, such as the electromagnetic imager tools described herein. Each of the logging tools 126 may include one or more tool components spaced apart from each other and communicatively coupled by one or more wires and/or other communication arrangement. The logging tools 126 may also include one or more computing devices communicatively coupled with one or more of the tool components. The one or more computing devices may be configured to control or monitor a performance of the tool, process logging data, and/or carry out one or more aspects of the methods and processes of the present disclosure. The collected log data may include measurements such as gamma ray (GR), neutron porosity (NPHI), bulk density (RHOB), and resistivity (RT), which may be used as input to machine learning models for reconstructing other logs such as compressional slowness (DTC) or shear slowness (DTS), as described in connection with FIGS. 3-7. In some cases, the input logs may additionally or alternatively include: wireline or LWD logs, drilling-derived measurements such as rate of penetration (ROP) or weight on bit (WOB), image logs, interpreted formation properties such as porosity, saturation, brittleness, or lithofacies, and synthetic or augmented log samples generated by simulation or generative modeling techniques.

The bottom-hole assembly 125 may also include a telemetry sub 128 to transfer measurement data to a surface receiver 132 and to receive commands from the surface. In at least some cases, the telemetry sub 128 communicates with a surface receiver 132 by wireless signal transmission (e.g., using mud pulse telemetry, EM telemetry, or acoustic telemetry). In other cases, one or more of the logging tools 126 may communicate with a surface receiver 132 by a wire, such as wired drill pipe. In some instances, the telemetry sub 128 does not communicate with the surface, but rather stores logging data for later retrieval at the surface when the logging assembly is recovered. In at least some cases, one or more of the logging tools 126 may receive electrical power from a wire that extends to the surface, including wires extending through a wired drill pipe. In other cases, power is provided from one or more batteries or via power generated downhole.

Collar 134 is a frequent component of a drill string 108 and generally resembles a very thick-walled cylindrical pipe, typically with threaded ends and a hollow core for the conveyance of drilling fluid. Multiple collars 134 can be included in the drill string 108 and are constructed and intended to be heavy to apply weight on the drill bit 114 to assist the drilling process. Because of the thickness of the collar's wall, pocket-type cutouts or other type recesses can be provided into the collar's wall without negatively impacting the integrity (strength, rigidity and the like) of the collar as a component of the drill string 108. In some cases, the wellbore drilling scenario 100 can include one or more computing systems, such as the computing device architecture 1000 shown in FIG. 10. In some instances, the wellbore drilling scenario 100 can include one or more computing systems that implement log imputation models, such as the machine learning systems shown in FIGS. 2-5. These systems may receive raw or partially complete log data acquired by the logging tools 126 and apply coefficient-based and/or latent-variable-based inference to reconstruct missing log values, as described in connection with the systems and methods shown in FIGS. 2 through 7.

Figure 1B:
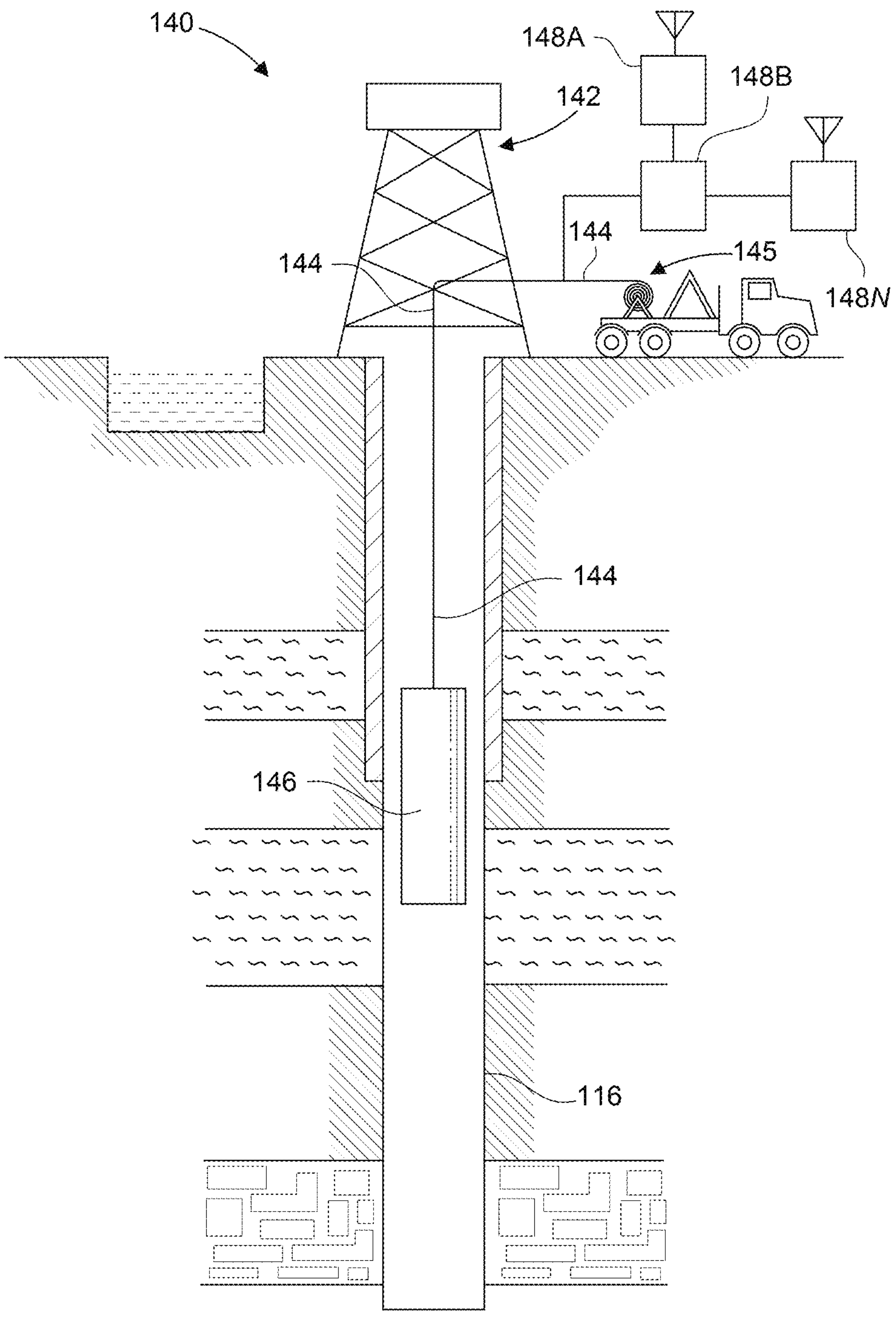
FIG. 1B is a schematic side-view of the example logging environment of FIG. 1A, according to some examples of the present disclosure.

FIG. 1B is a schematic diagram of an example downhole environment having tubulars, according to some examples of the present disclosure. In this example, an example system 140 is depicted for conducting downhole measurements after at least a portion of a wellbore has been drilled and the drill string removed from the well. An electromagnetic imager tool (not shown) can be operated in the example system 140 shown in FIG. 1B to log the wellbore. A downhole tool is shown having a tool body 146 in order to carry out logging and/or other operations. For example, instead of using the drill string 108 of FIG. 1A to lower the downhole tool, which can contain sensors and/or other instrumentation for detecting and logging nearby characteristics and conditions of the wellbore 116 and surrounding formations, a wireline conveyance 144 can be used. The tool body 146 can be lowered into the wellbore 116 by wireline conveyance 144. The wireline conveyance 144 can be anchored in the drill rig 142 or by a portable means such as a truck 145. The wireline conveyance 144 can include one or more wires, slicklines, cables, and/or the like, as well as tubular conveyances such as coiled tubing, joint tubing, or other tubulars. The downhole tool can include an applicable tool for collecting measurements in a drilling scenario, such as the electromagnetic imager tools described herein.

The illustrated wireline conveyance 144 provides power and support for the tool, as well as enabling communication between data processors 148A-Non the surface. In some examples, the wireline conveyance 144 can include electrical and/or fiber optic cabling for carrying out communications. The wireline conveyance 144 is sufficiently strong and flexible to tether the tool body 146 through the wellbore 116, while also permitting communication through the wireline conveyance 144 to one or more of the processors 148A-N, which can include local and/or remote processors. The processors 148A-N can be integrated as part of an applicable computing system, such as the computing device architectures described herein. Moreover, power can be supplied via the wireline conveyance 144 to meet power requirements of the tool. For slickline or coiled tubing configurations, power can be supplied downhole with a battery or via a downhole generator.

In some examples, the data processors 148A-N may execute or interface with machine learning models configured to process logged well data, reconstruct missing measurements, or generate synthetic logs using coefficient inference or VAE-based reconstruction (e.g., as described in FIGS. 2-7).

Figure 2:
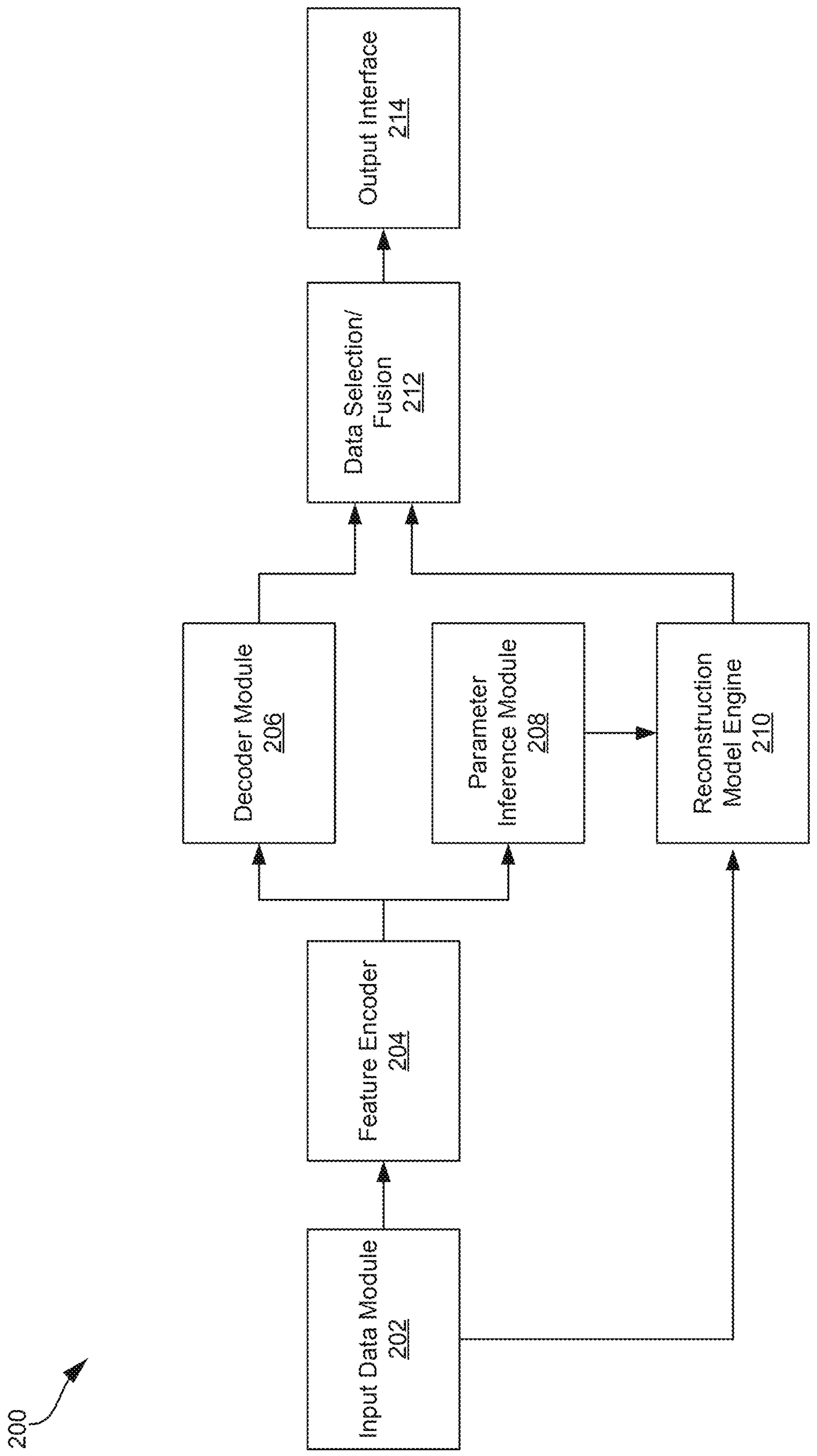
FIG. 2 is a block diagram of an example log imputation system, according to some examples of the present disclosure.

FIG. 2 illustrates an example system 200 that can be configured to perform well log reconstruction and subsurface property estimation using a machine learning framework. In some aspects, system 200 may be implemented using generative reconstruction techniques and/or physics-guided inference. As shown, the system 200 may include an input data module 202, a feature encoder 204, a decoder module 206, a parameter inference module 208, a reconstruction model engine 210, a data selection or fusion module 212, and an output interface 214.

In some configurations, the input data module 202 may be configured to receive and format various types of well-related input data. In some instances, the input data may include raw or partially processed well log measurements such as gamma ray (GR), neutron porosity (NPHI), bulk density (RHOB), photoelectric factor (PE), or resistivity (RT). In other instances, the input data may include wireline logs, logging-while-drilling (LWD) logs, drilling-derived measurements (e.g., rate of penetration, weight on bit), image logs, interpreted formation properties (e.g., geological layers or facies), synthetic logs, and/or augmented samples generated by simulation or generative modeling.

In some aspects, the feature encoder 204 may be configured to transform the input data into a representation suitable for downstream inference tasks. For instance, the feature encoder 204 may project the input data into a latent or feature space that can be used to capture inter-log dependencies, geological context, and/or depth-wise trends. In some cases, the encoded representation generated by feature encoder 204 may be routed to multiple downstream branches. For example, the encoded representation may be provided to a decoder module 206 configured to generate missing or corrupted logs via direct reconstruction. In addition, or alternatively, the encoded representation may be provided to a parameter inference module 208 configured to estimate one or more parameters of a reconstruction model (e.g., coefficients of a predefined petrophysical equation or other parameterized function).

In some configurations, the feature encoder 204 may be implemented as part of a variational autoencoder (VAE), in which the encoded representation defines a latent probability distribution from which samples are drawn. In other cases, the feature encoder 204 may include a deterministic neural network such as a multilayer perceptron (MLP), a convolutional encoder, or a transformer-based set encoder capable of processing unordered log segments within geologically defined intervals.

In some cases, the decoder module 206 may be configured to reconstruct log measurements directly from the latent representation generated by the feature encoder 204. In some aspects, the decoder module 206 may serve as the generative branch of a VAE model and may be trained to reconstruct missing or corrupted logs, such as sonic slowness logs, including Delta-T Compressional (DTC, i.e., compressional slowness) and Delta-T Shear (DTS, i.e., shear slowness), based on samples drawn from the latent space. In some instances, the decoder module 206 may generate multiple samples for the same input context to enable uncertainty quantification. In some cases, the decoder module 206 may only be used during training to supervise the latent representation and may not be required during inference. For example, the decoder module 206 may be used to compute a reconstruction loss against reference values or expert-labeled parameters during training of a variational autoencoder (VAE), but during inference, the system may omit the decoder entirely and estimate reconstruction model parameters directly from the latent representation. In some configurations, the decoder module 206 may include one or more layers of a feedforward neural network, a recurrent network (e.g., LSTM or GRU), or a transformer decoder. In some examples, the decoder module 206 may produce point estimates and may also predict uncertainty ranges, confidence scores, and/or sample distributions.

In some aspects, the parameter inference module 208 may be configured to infer coefficients for a parameterized reconstruction function based on the encoded features. In some configurations, the parameterized reconstruction function may include a predefined petrophysical equation, a multi-step computational process, a domain-specific workflow, or a physics-based mapping used to generate target log values from known inputs. In some cases, these functions may be governed by one or more tunable parameters, which can be estimated from the latent representation of the input data. For example, in some cases, the system may apply a linear sonic model of the form below, where coefficients $C=[a, b, c, d, e, f]^T$ can be inferred from the latent representation.

$$DTC = a*RHOB + b*NPHI + c,$$

$$DTS = d*RHOB + e*NPHI + f$$

In some configurations, the parameter inference module 208 may be trained using a two-stage approach that incorporates both coefficient-level supervision and end-to-end reconstruction loss. In a first stage, the system may minimize a coefficient loss function defined as:

$$\mathrm{Loss}_{pt} = \|NN(x; \theta) - C\|_2^2,$$

where NN(x; θ) denotes the neural network's predicted coefficient vector, C denotes the target coefficients obtained via least-squares regression from training data, and x denotes the input log segment. In a second stage, the model may be fine-tuned by minimizing a preconditioning loss based on the application of a parameterized reconstruction function, such as a predefined petrophysical equation p, as follows:

$$\mathrm{Loss}_{ft} = \|p(NN(x; \theta); (NPHI, RHOB)) - (DTC, DTS)\|_2^2$$

where p represents the physical mapping from coefficients and known input logs to the target output logs. In some cases, this formulation can enable the system to learn interpretable coefficients that are physically meaningful while optimizing prediction accuracy.

In some aspects, the reconstruction model engine 210 may apply the predefined equation using the inferred coefficients and one or more known logs from the input data module 202. In some cases, the reconstruction model engine 210 may implement linear or nonlinear petrophysical models and may support equation sets beyond sonic equations, including, for example, models for water saturation (e.g., Archie's equation), formation factor, and/or RHOB estimation. In some configurations, the equations may be globally applicable or adapted to field-specific lithology or tool response characteristics. In some instances, the use of a reconstruction model engine 210 may enhance physical consistency and interpretability relative to direct neural network prediction.

In some configurations, outputs from the decoder module 206 and the reconstruction model engine 210 may be routed to a data selection or fusion module 212. In some aspects, this data selection/fusion module 212 may be configured to compare, blend, or arbitrate between the outputs from decoder module 206 and reconstruction model engine 210. In some cases, the selection logic may be based on heuristic rules (e.g., lithology-specific confidence thresholds), and in other cases it may be learned using a trained blending model. In some configurations, the data selection/fusion module 212 may assign higher weight to physics-guided outputs in regions with high log coverage or strong tool-response calibration, and higher weight to generative outputs in data-sparse or noisy intervals. In some aspects, the data selection/fusion module 212 may produce both fused outputs and corresponding metadata indicating the dominant source or confidence level. In some aspects, the fusion module 212 may assign weights based on uncertainty estimates, lithology-specific heuristics, or quality metrics associated with individual reconstruction branches. In other cases, a learned blending network may be used to combine outputs from the decoder and equation-based model based on past performance or metadata.

In some cases, the output from the data selection/fusion module 212 may be provided to an output interface 214. In some aspects, the output interface 214 may expose reconstructed log traces, derived petrophysical properties (e.g., brittleness, mobility index, lithofacies), and/or confidence metrics. In some configurations, the output may be used to augment mechanical earth models, support formation evaluation, enable geosteering, or populate training datasets for downstream machine learning applications. In some instances, the output interface 214 may be designed for real-time use, enabling on-the-fly imputation during drilling or logging operations.

In some configurations, the system 200 may be implemented to support multiple operational modes. In one mode, only the decoder module 206 may be active, and the system may operate as a pure generative model using VAE-based reconstruction. In another mode, the decoder path may be disabled and only the parameter inference module 208 and reconstruction model engine 210 may be used, forming a physics-guided pipeline. In some cases, both paths may be active, with the outputs either fused or ranked according to task-specific criteria (e.g., by the data selection/fusion module 212). In some aspects, the architecture may support training or deployment with shared encoders and task-specific branches, enabling multi-task learning and cross-domain generalization. In such configurations, the decoder 206 can receive latent vectors sampled from the VAE encoder and produces log reconstructions without invoking the parameter inference or physics-based reconstruction path. In some cases, a VAE-only mode may be used in data-rich intervals, during uncertainty sampling, or for log inpainting tasks.

In some cases, the system 200 may be applied to intra-log or inter-log imputation scenarios. Intra-log imputation may involve reconstructing missing segments within a single log channel due to borehole anomalies or tool dropout. Inter-log imputation may involve synthesizing missing log channels that were not acquired in a given well, such as generating sonic logs from a triple combo dataset. In some aspects, the system 200 may also be extended to handle time-lapse data (e.g., repeated logging in observation wells), or to support inverse design workflows in which synthetic logs are generated from desired rock property profiles. In some cases, the reconstructed logs may be derived using a parameterized reconstruction function, which may correspond to a petrophysical model, a chained operation sequence, or another structured process governed by estimated parameters. In some cases, the reconstructed outputs may be used to generate input features for downstream applications such as facies classification, reservoir modeling, or production forecasting. Such downstream tasks may consume the reconstructed logs directly and/or in combination with other geophysical or geological data.

Figure 3:
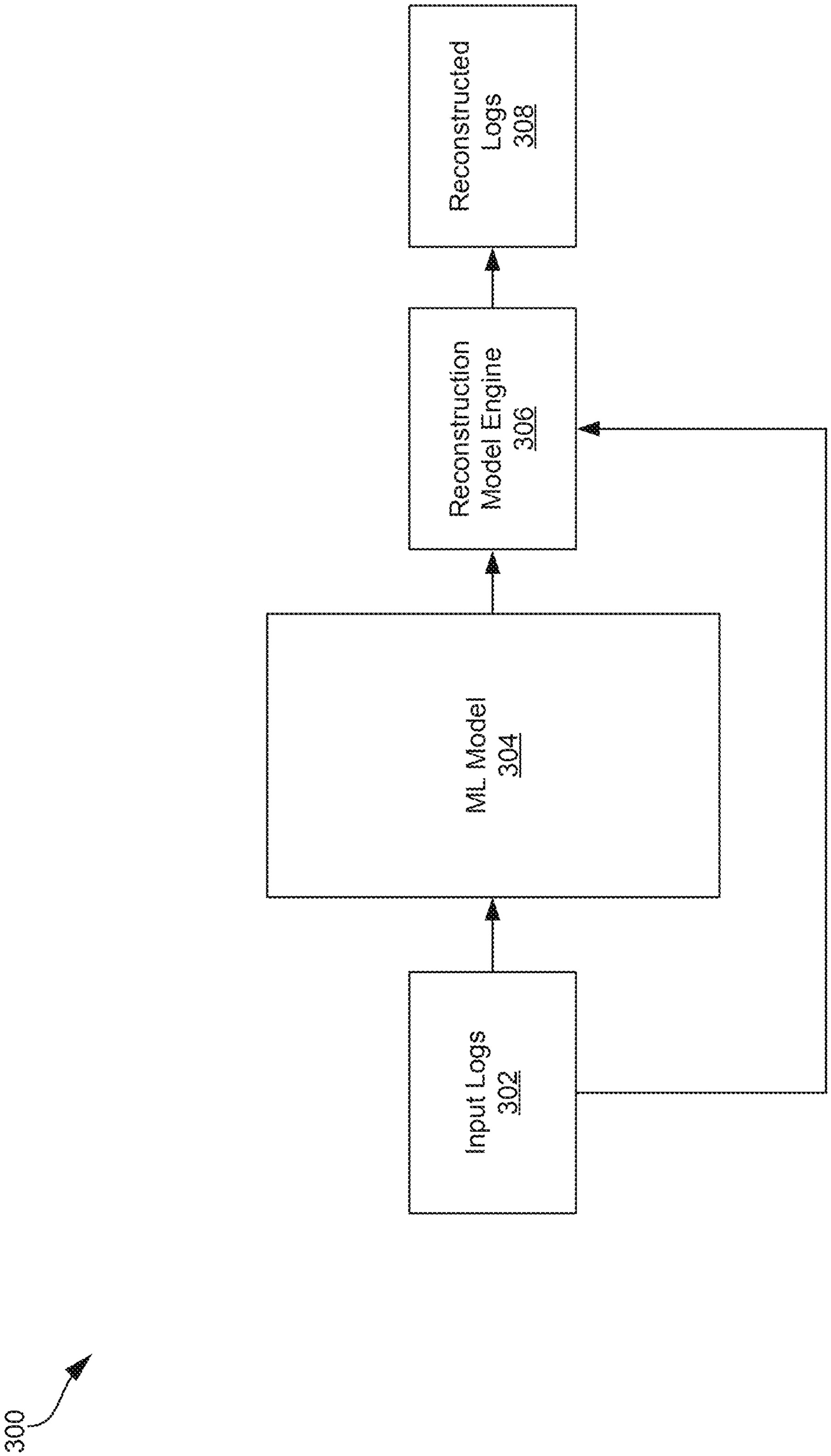
FIG. 3 is a block diagram of an example system for predicting coefficients for use in a parameterized reconstruction model, according to some examples of the present disclosure.

FIG. 3 illustrates an example workflow 300 for reconstructing well log measurements using a machine learning model trained to infer parameters of a reconstruction model. The workflow 300 includes input logs 302, a machine learning (ML) model 304, a reconstruction model engine 306, and reconstructed logs 308. In some configurations, the components shown in FIG. 3 may correspond to submodules within the hybrid system architecture of FIG. 2, such as the parameter inference module 208 and the reconstruction model engine 210.

In some aspects, the input logs 302 may include a set of log measurements collected over one or more depth intervals. In some configurations, the input logs 302 may consist of a single depth-wise feature vector, while in other configurations the input logs 302 may include a depth-windowed segment of log data. In some instances, the input logs 302 may include measurements such as gamma ray (GR), neutron porosity (NPHI), bulk density (RHOB), photoelectric factor (PE), resistivity (RT), transformed logs (e.g., Log(RT)), any other type of input log, and/or any combination thereof. In some instances, additional derived or interpreted logs may also be included, such as facies classifications or drilling parameters.

In some configurations, the input logs 302 may further include wireline logs, logging-while-drilling (LWD) logs, drilling-derived measurements (e.g., rate of penetration, weight on bit), image logs (e.g., borehole televiewer or microresistivity images), interpreted formation properties (e.g., porosity, saturation, brittleness, or lithofacies), and synthetic or augmented data samples generated through simulation or generative modeling. In some cases, input logs may be selected based on availability, data quality, or relevance to the target property being reconstructed. In some implementations, the input data may also include contextual metadata such as well identifiers, formation names, interpreted geological zones, or other spatial or temporal indicators that enable context-aware inference across wells or basins. In some cases, the target log being reconstructed may not be present in the input logs or may be partially missing, such that the ML model operates without full access to the target log during inference.

In some configurations, the ML model 304 may be configured to infer one or more coefficients associated with a reconstruction model, such as a predefined petrophysical equation, a chained computation workflow, or a structured process that may be governed by one or more tunable parameters. For example, the model 304 may receive the input logs 302 and output a vector of coefficients representing formation-specific parameters. In one case, the model may be trained to predict coefficients [a, b, c, d, e, f] for use in a linear sonic model of the form:

$$DTC=a*RHOB+b*NPHI+c,$$

$$DTS=d*RHOB+e*NPHI+f.$$

In some aspects, the coefficients may be inferred using a neural network model such as a multilayer perceptron (MLP), convolutional network, or transformer-based architecture. In some instances, the model may be trained using a two-stage procedure, as described in connection with FIG. 2, which may include pretraining on regression-derived coefficient labels and fine-tuning based on reconstruction loss.

In some aspects, the reconstruction model engine 306 may apply the parameterized reconstruction function using the coefficients output by the ML model 304 and one or more known input logs from the input logs 302. In some configurations, only a subset of the logs provided to the ML model (e.g., RHOB and NPHI) may be routed to the reconstruction model engine 306. In other cases, the reconstruction model engine 306 may be configured to accept alternative or additional logs, depending on the form of the target equation. For example, in the case of reconstructing water saturation using Archie's equation, the reconstruction model engine 306 may receive resistivity and porosity as inputs. Those skilled in the art will recognize that workflow 300 is therefore not limited to any particular log subset or equation form, or reconstruction model type, and may be adapted to support a wide range of parameterized reconstruction models.

In some configurations, the reconstructed logs 308 may include compressional and shear slowness logs such as Delta-T Compressional (DTC) and Delta-T Shear (DTS). In other cases, the outputs may include other physical properties such as formation factor, bulk density, water saturation, or velocity. The reconstructed logs 308 may be used in downstream workflows such as petrophysical interpretation, reservoir modeling, or data augmentation. In some instances, confidence metrics or quality flags may be generated based on the residuals or inferred uncertainties associated with the reconstruction. In some aspects, the reconstructed logs may be used as target logs for imputation, as inputs to downstream workflows such as facies classification or production forecasting, or to estimate derived formation properties such as porosity, saturation, or brittleness.

In some aspects, the coefficient-based reconstruction method shown in FIG. 3 may be implemented independently or as part of a hybrid system architecture such as that shown in FIG. 2. In some configurations, the ability to decouple the parameter inference process from the application of the reconstruction model allows for greater interpretability, modularity, and consistency with domain knowledge. In some instances, the system may be configured to support dynamic selection of equations and input logs based on well conditions, formation type, or available measurements.

Figure 4:
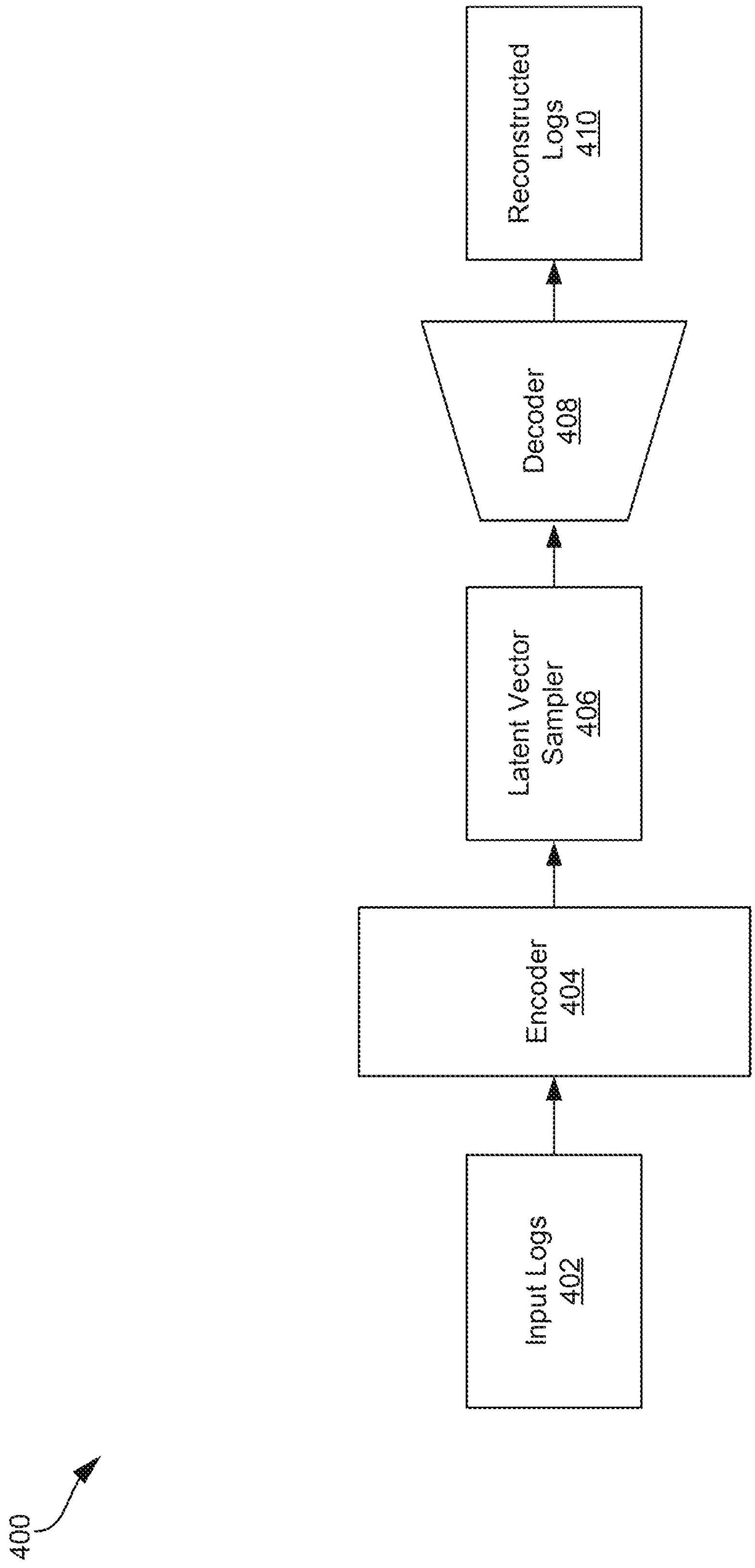
FIG. 4 is a block diagram of a VAE-based reconstruction system, according to some examples of the present disclosure.

FIG. 4 illustrates an example system 400 for reconstructing well log data using a variational autoencoder (VAE) architecture. As shown, the system 400 includes input logs 402, an encoder 404, a latent vector sampler 406, a decoder 408, and reconstructed logs 410.

In some configurations, the input logs 402 may include one or more depth-wise log measurements, either in the form of individual vectors or as segments spanning multiple depth samples. In some aspects, the input logs 402 may include gamma ray (GR), neutron porosity (NPHI), bulk density (RHOB), photoelectric factor (PE), resistivity (RT), and/or other physical measurements derived from wireline or while-drilling tools. In some instances, the input logs 402 may also include transformed or interpreted features such as logarithmic resistivity, derived porosity indicators, or facies classifications. In some cases, the input logs 402 may exclude or incompletely represent one or more target logs that are to be reconstructed.

In some aspects, the encoder 404 may be configured to transform the input logs 402 into a latent distribution. In one configuration, the encoder 404 may be implemented as a neural network that outputs a mean vector and a standard deviation vector a, which together parameterize a multivariate Gaussian distribution over the latent space. In some cases, the encoder 404 may be implemented using convolutional layers, recurrent layers, or transformer-based architectures that account for geologic context across depth. In some examples, the latent distribution may capture global and local structure in the input logs, including inter-log dependencies and depth-wise variability.

In some configurations, the latent vector sampler 406 may receive the encoder outputs and apply the reparameterization trick to generate a latent sample vector z. In some instances, the vector z may be sampled according to the formula:

$$z=\mu+\sigma■\epsilon, \text{ where } \epsilon\sim\mathcal{N}(0,I)$$

In some instances, such a configuration can be used to enable gradient-based training through the stochastic sampling step. In some cases, multiple latent vectors may be sampled per input instance to generate an ensemble of reconstructions or to estimate predictive uncertainty.

In some aspects, the decoder 408 may be configured to receive the sampled latent vector and generate one or more reconstructed logs. In some configurations, the decoder 408 may consist of a multilayer perceptron, a recurrent decoder, or a transformer-based generative model. In some implementations, the decoder 408 may output continuous log predictions, uncertainty ranges, or derived values. In some cases, the decoder 408 may be trained to reconstruct specific missing log channels, such as compressional slowness (Delta-T Compressional, DTC), shear slowness (Delta-T Shear, DTS), or other unmeasured or corrupted curves. In some configurations, the decoder 408 may be used during training to supervise the latent representation and may be omitted during inference in favor of other reconstruction pathways.

In some instances, the reconstructed logs 410 may include one or more predicted values corresponding to missing or incomplete log channels. In some cases, the reconstructed logs 410 may be used for inter-log imputation (e.g., generating sonic logs from triple combo data), intra-log imputation (e.g., filling gaps due to tool dropout), or downstream processing (e.g., property estimation or synthetic well generation). In some configurations, uncertainty measures associated with the latent space or decoder outputs may be propagated to the final reconstructed logs 410, allowing for quality assessment and confidence weighting.

In some aspects, the variational autoencoder architecture shown in FIG. 4 may be used independently or in combination with other inference modules such as those described in FIG. 2 and FIG. 3. In some configurations, the encoder 404 may be shared across multiple reconstruction branches, enabling joint training or hybrid inference modes.

Figure 5:
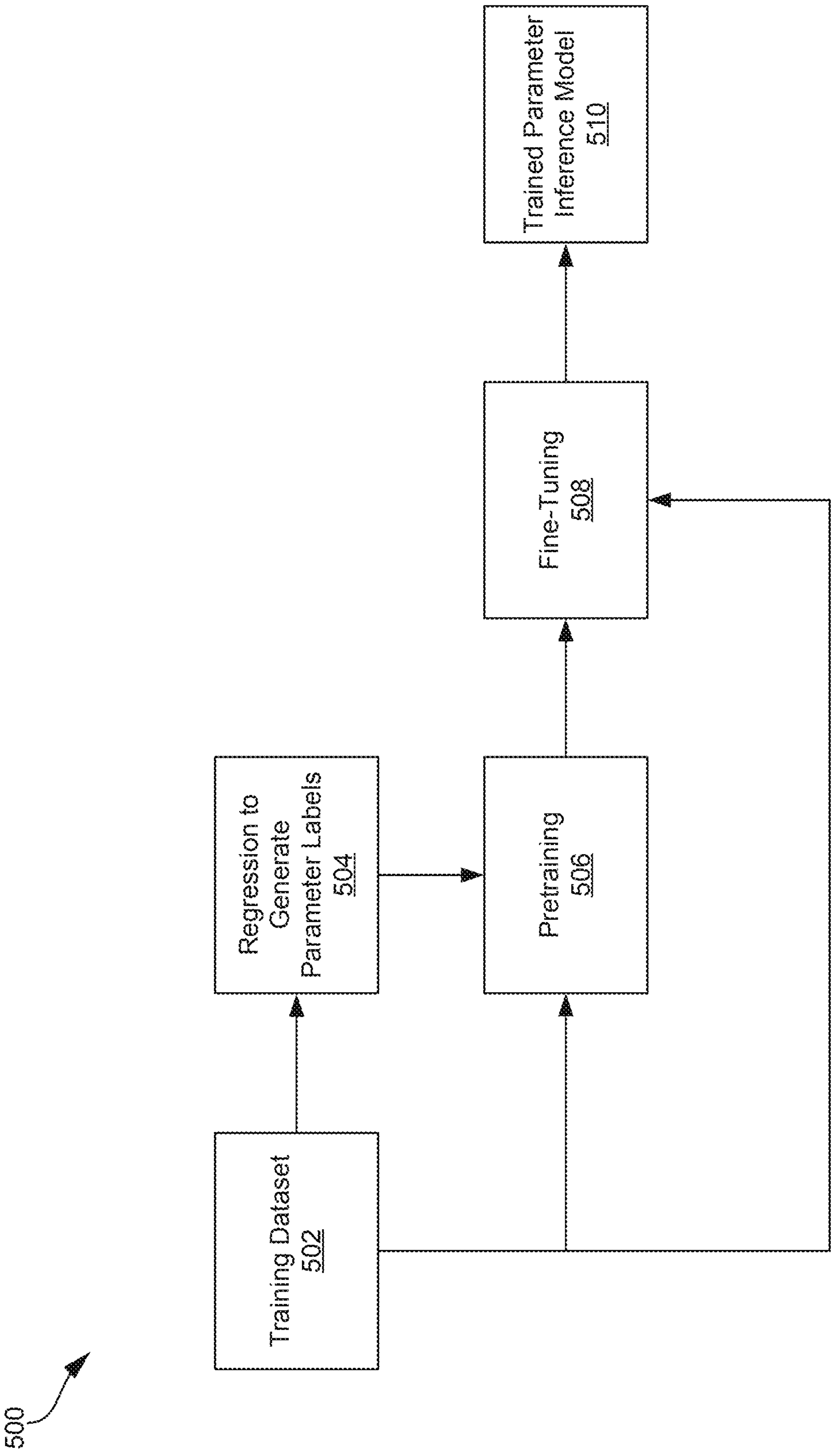
FIG. 5 is a block diagram of an example attention-based encoder system configured to infer reconstruction parameters from available input logs, according to some examples of the present disclosure.

FIG. 5 illustrates an example training workflow 500 for generating a parameter inference model that can be used in log reconstruction. As shown, the workflow 500 includes a training dataset 502, a regression module 504 configured to generate parameter labels, a pretraining stage 506, a fine-tuning stage 508, and a final trained model 510.

In some configurations, the training dataset 502 may include pairs of input log vectors x and corresponding target log values y, such as sonic measurements (e.g., DTC, DTS). The input vectors may include one or more measurements such as gamma ray (GR), neutron porosity (NPHI), bulk density (RHOB), photoelectric factor (PE), and resistivity (RT), among others. In some instances, the training dataset 502 may be preprocessed to align sampling rates, handle missing values, or apply depth-wise transformations such as logarithmic scaling of resistivity.

In some cases, a regression module 504 may be applied to the training data 502 to generate one or more tunable parameter labels using a predefined petrophysical model. For example, given a linear sonic equation of the form:

$$\mathrm{DTC}=a*\mathrm{RHOB}+b*\mathrm{NPHI}+c$$

In some aspects, the regression module 504 may solve for the coefficients a, b, c that best fit the measured DTC values using least-squares minimization. In some configurations, this step may be repeated for multiple training instances to produce a labeled dataset of input vectors and corresponding regression-derived parameter vectors.

In some configurations, the pretraining module 506 may be used to initialize a machine learning model by minimizing a loss function based on the difference between the predicted parameters NN(x; θ) and the regressed parameters C. In some cases, the loss function may take the form:

$$\mathrm{Loss}_{pt}=\|NN(x;\theta)-C\|_2^2,$$

where NN(x; θ) denotes the model output given input logs x and parameters θ. In some aspects, this pretraining phase can help the model learn physically meaningful relationships and accelerate convergence during later stages of training.

In the next stage, the fine-tuning module 508 may further train the model using an output-based loss function that compares reconstructed log values to the reference target log values in the training dataset 502. In some cases, the reference target log values may correspond to physical measurements obtained directly from well logs. In other cases, the reference values may be generated through regression, expert interpretation, or heuristics derived from similar formations or offset wells. As such, the reference targets may not represent absolute ground truth but can serve as useful supervisory signals during training. In some configurations, the predicted parameters are passed through a petrophysical equation (e.g., the sonic model) to reconstruct the log values. The fine-tuning loss may be defined as:

$$\text{Loss}_{ft} = \|f(NN(x;\theta);x) - y\|_2^2,$$

In this formulation, y represents the reference target log values and θ represents the parameters of the machine learning model. The function NN(x; θ) denotes the predicted parameter vector produced by the model. The function f(•; x) represents a predefined reconstruction model applied using both the predicted parameters and the appropriate known log inputs (such as RHOB or NPHI) from x. The loss function thus measures the discrepancy between the reconstructed logs and the reference values.

In some cases, the trained model 510 produced by the workflow 500 may be deployed in production settings to perform parameter-based inference as described in FIG. 3. In some aspects, the model may be combined with a reconstruction model engine for forward prediction, log reconstruction, or data augmentation tasks. In some configurations, the training procedure shown in FIG. 5 may be extended to include domain-specific regularization, uncertainty calibration, or active learning feedback.

Figure 6:
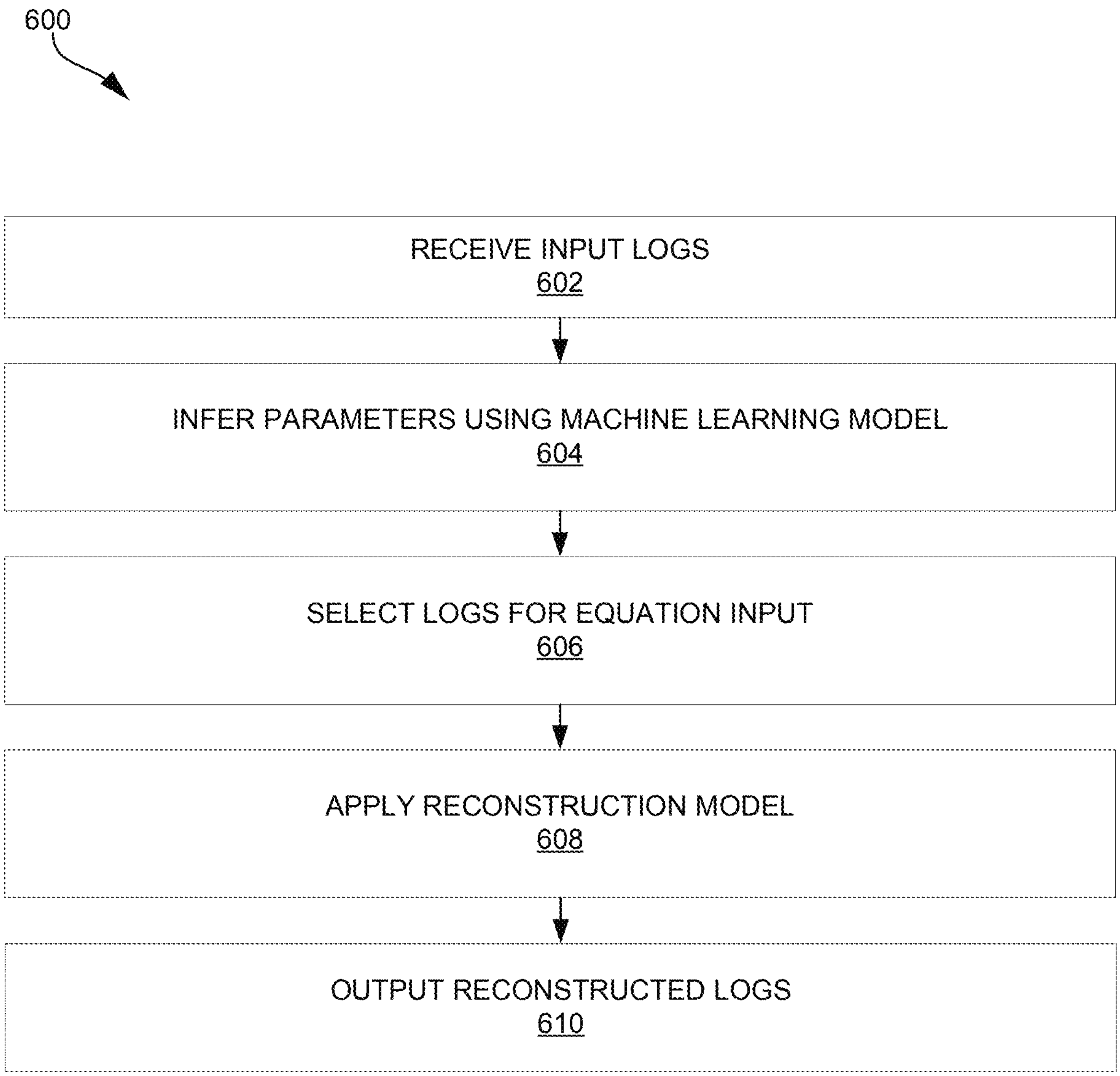
FIG. 6 is a flowchart of an example training workflow for a coefficient-based reconstruction system, according to some examples of the present disclosure.

FIG. 6 illustrates an example process 600 for reconstructing well logs using a parameter-based inference model and a reconstruction model. Although the process 600 depicts a particular sequence of operations, the order of operations may be altered in some implementations without departing from the scope of the disclosure. For example, some of the steps may be performed concurrently or in a different sequence. In some configurations, different components of the system 300 shown in FIG. 3 may perform functions at substantially the same time or in a specific execution order.

At block 602, the process 600 includes receiving input logs for one or more depth intervals. For example, the input data module 302 of system 300 may receive or access log data such as gamma ray (GR), neutron porosity (NPHI), bulk density (RHOB), photoelectric factor (PE), and resistivity (RT). In some cases, the input logs may be organized as depth-aligned segments or windows, each representing a short interval of a wellbore. The input data may be arranged as a matrix of features per depth step, and may include transformed values such as logarithmic resistivity. The input logs may include wireline logs, logging-while-drilling (LWD) logs, drilling-derived measurements, interpreted formation properties, and/or synthetic or augmented samples.

At block 604, the process 600 includes inferring parameters using a machine learning model. For instance, the ML model 304 of FIG. 3 may be configured to generate a vector of tunable parameters based on the input logs within a given segment. In some cases, the parameters may be specific to the local geologic conditions reflected in the input data. The model may be trained to learn such localized relationships and may output a distinct parameter set for each segment. Model architectures may include fully connected networks or transformer-based models that capture contextual dependencies. In some configurations, the model may be trained using a two-stage process involving pretraining on regressed parameters and fine-tuning on output reconstruction accuracy, as described in FIG. 5.

At block 606, the process 600 includes selecting a subset of input logs to be used as inputs to a reconstruction model. For example, the reconstruction model engine 306 of FIG. 3 may be configured to identify the appropriate log channels required for evaluating the reconstruction function. In some configurations, the selected inputs may include RHOB and NPHI, while in other cases, additional or alternative logs may be used depending on the structure of the reconstruction model, governing equations, input requirements, and/or the intended output.

At block 608, the process 600 includes applying a reconstruction model using the predicted parameters and the selected logs. For instance, the reconstruction model engine 306 may be implemented as a modular system capable of evaluating a user-specified or system-defined formula. The resulting reconstructed output may correspond to a target log channel that was unavailable or missing from the input data. In some cases, the reconstructed model engine may support multiple predefined equations or workflows, enabling the system to generalize to different geophysical or petrophysical relationships beyond a single equation form.

At block 610, the process 600 includes outputting the reconstructed logs. For instance, the reconstructed logs 308 of system 300 may include compressional and/or shear slowness logs (e.g., DTC, DTS) generated for the input interval. These outputs may be used for various applications including quality control, synthetic well log generation, or estimation of derived rock properties such as brittleness, ductility, or acoustic impedance. In some configurations, the outputs may be passed to an interpretation system or visualized alongside the original input logs. Reconstructed data may also serve as inputs to reservoir property models, geomechanical simulators, or rock physics workflows.

In some configurations, the system may support optional operations such as uncertainty scoring, residual analysis, or dynamic selection of the most appropriate reconstruction function from a predefined library based on available inputs and metadata. These capabilities may be implemented within the reconstruction model engine 306 or by downstream modules such as the output interface 314.

Figure 7:
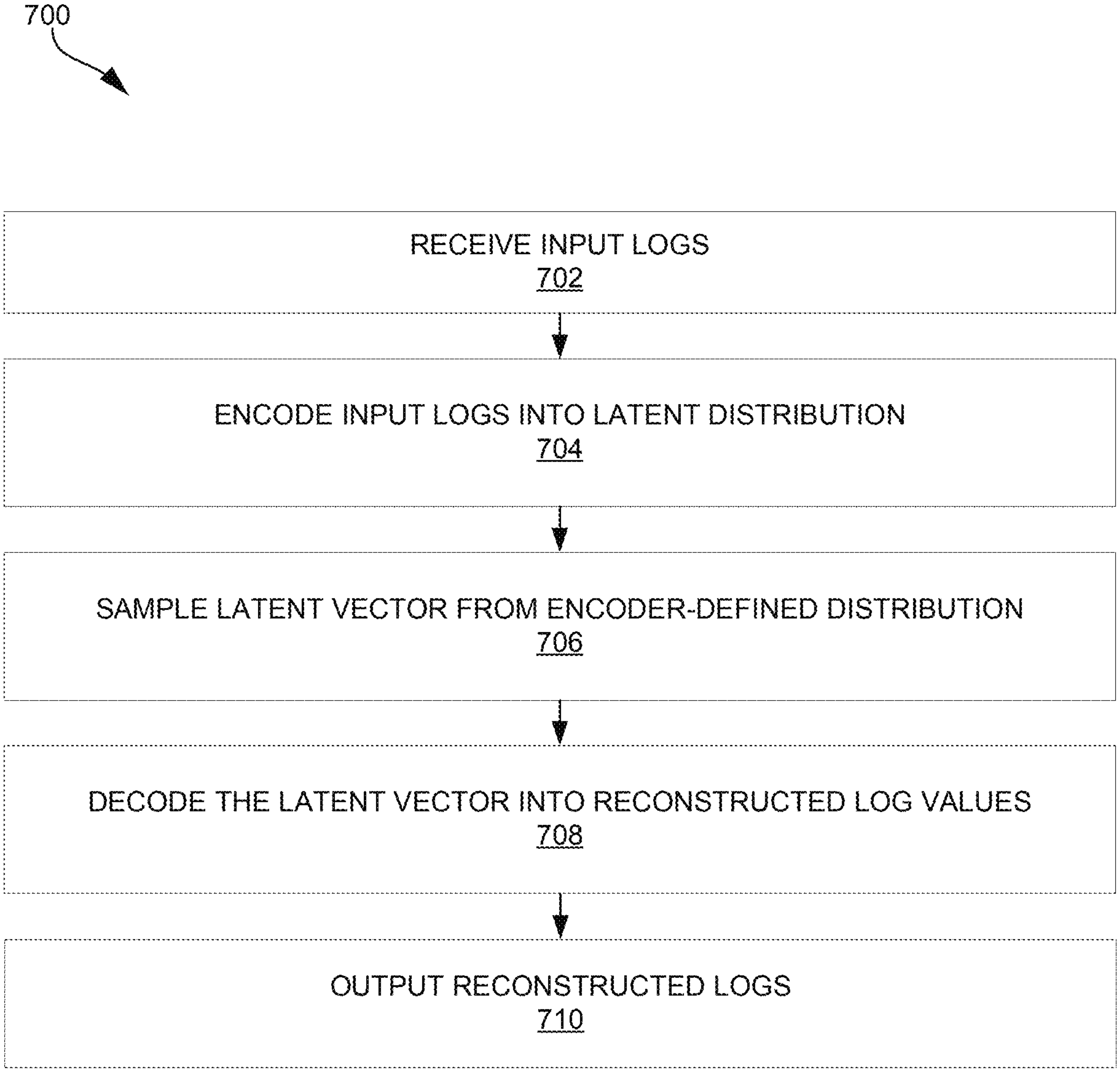
FIG. 7 is a flowchart of an example training workflow for a decoder-based reconstruction system, according to some examples of the present disclosure.

FIG. 7 illustrates an example process 700 for reconstructing well logs using a variational autoencoder (VAE). Although the process 700 depicts a particular sequence of operations, the steps may be reordered, performed concurrently, or distributed across system components without departing from the scope of the disclosure. In some configurations, different components of system 400 shown in FIG. 4 may perform functions at substantially the same time or in a different sequence.

At block 702, the process 700 includes receiving input logs for one or more depth intervals. For example, the input logs 402 of system 400 may include geophysical measurements such as gamma ray (GR), neutron porosity (NPHI), bulk density (RHOB), photoelectric factor (PE), and resistivity (RT). In some instances, the input logs may be organized as fixed-length windows, depth-aligned matrices, or feature sequences. In some configurations, missing channels may be represented using masking or zero-padding strategies, allowing the model to operate on incomplete data.

At block 704, the process 700 includes encoding the input logs into a latent distribution. For example, the encoder 404 of FIG. 4 may transform the input log segment into a latent space representation characterized by a mean vector and a standard deviation vector. In some configurations, the encoder may be implemented using convolutional layers, attention mechanisms, or other architectures capable of capturing spatial or contextual relationships across input features. The encoded distribution defines a probability space over latent variables that compactly represent the log segment.

At block 706, the process 700 includes sampling a latent vector from the encoder-defined distribution. For instance, the latent vector sampler 406 may generate a sample using a reparameterization approach that enables gradient flow during training. In some cases, the sampling step may introduce stochasticity, allowing the model to capture uncertainty and variability in the reconstruction process. In production, the system may sample a single latent vector or generate multiple reconstructions for ensemble-style outputs.

At block 708, the process 700 includes decoding the latent vector into reconstructed log values. For example, the decoder module 408 of system 400 may receive the sampled latent vector and produce one or more continuous-valued outputs representing reconstructed log channels. In some configurations, the decoder may generate a full reconstructed feature vector or only the missing log components. Output may include synthetic or imputed values corresponding to channels such as compressional slowness (DTC) and shear slowness (DTS).

At block 710, the process 700 includes outputting the reconstructed logs. For instance, the reconstructed logs 410 may be returned as a structured array, visualization-ready curves, or input to downstream modules. In some configurations, the output may include uncertainty estimates or reconstruction confidence scores derived from the latent distribution. The reconstructed values may be used for visualization, modeling, or property estimation tasks.

In some cases, the process 700 may be applied iteratively or in conjunction with quality control steps to identify outliers, detect tool anomalies, or supplement sparse logging programs. The VAE architecture may support applications including gap-filling, synthetic well generation, data augmentation, or facies-consistent reconstruction across geologic zones.

Figure 8:
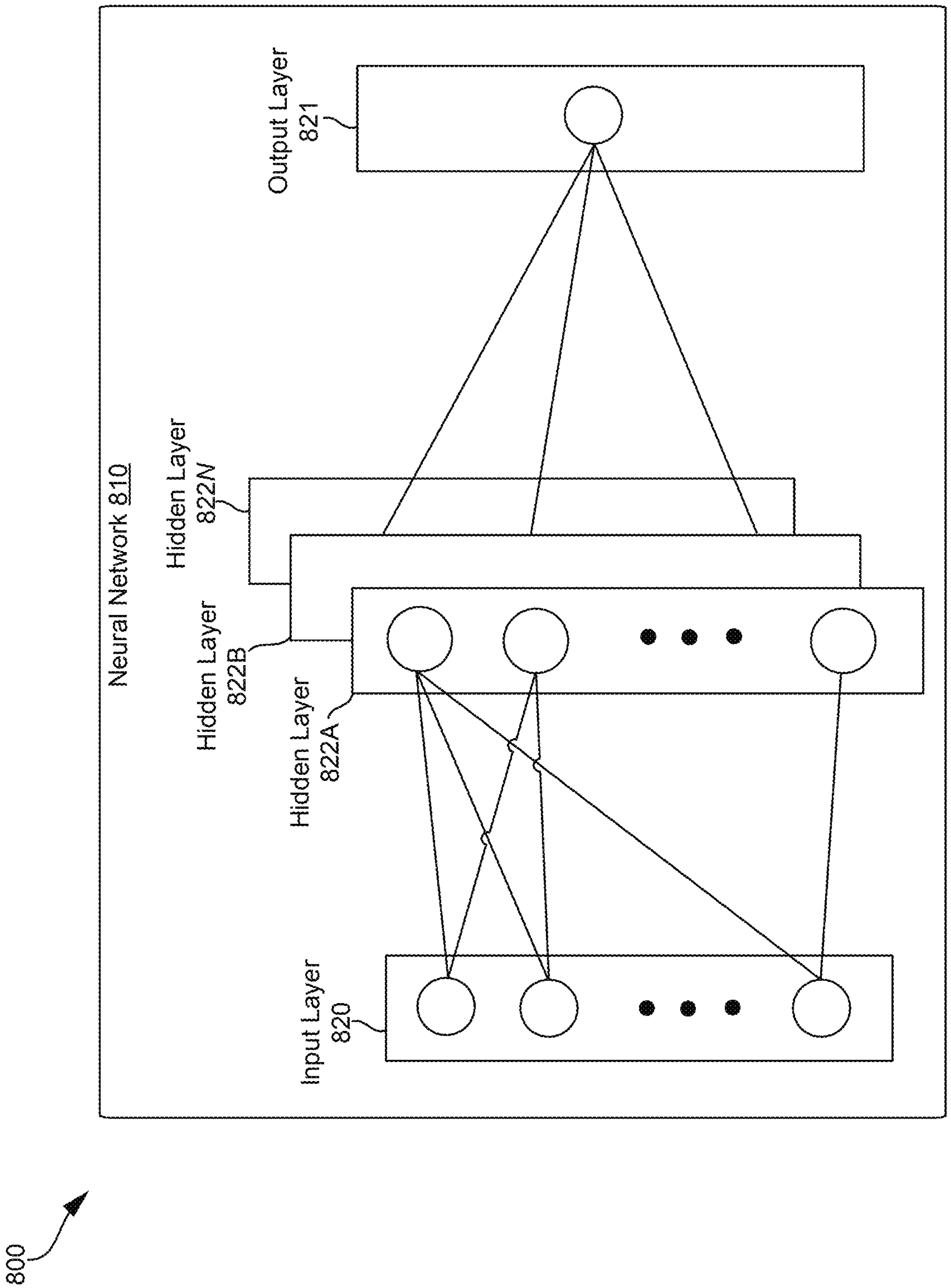
FIG. 8 is a diagram illustrating an example neural network architecture that can be used to implement any of the artificial intelligence models described herein, according to some examples of the present disclosure.

FIG. 8 is a diagram illustrating an example architecture 800 of an example neural network 810, according to some examples of the present disclosure. The example architecture 800 of the neural network 810 can be used to implement any AI/ML model, algorithm, and neural network described herein and/or any components described herein that can include or implement an AI/ML model(s), algorithm(s), or neural network(s). For example, the neural network 810 can be used to implement machine learning components described with reference to FIGS. 2 through 5, including, for instance, feature encoder 204, decoder module 206, parameter inference module 208, coefficient inference model 304, encoder 404, decoder 408, and/or the neural network trained using the workflow of FIG. 5. This architecture 800 can also represent a generalized neural network that may be used to implement other AI/ML models described herein.

The architecture 800 of the neural network 810 can include an input layer 820 that can be configured to receive and process data to generate one or more outputs. The architecture 800 of the neural network 810 can also include hidden layers 822*a*, 822*b*, through 822*n*. The hidden layers 822*a*, 822*b*, through 822*n* include "n" number of hidden layers, where "n" is an integer greater than or equal to one. The number of hidden layers can be made to include as many layers as needed for the given application. For instance, the number of hidden layers can be adjusted based on the complexity of the reconstruction task, the amount of input context available, and/or the dimensionality of the target output. The architecture 800 of the neural network 810 can further include an output layer 821 that provides an output resulting from the processing performed by the hidden layers 822*a*, 822*b*, through 822*n*.

The neural network 810 is a multi-layer neural network of interconnected nodes. Each node can represent a piece of information. Information associated with the nodes is shared among the different layers, and each layer can retain information as information is processed. In some examples, the neural network 810 can include a feed-forward network, in which case there are no feedback connections where outputs of the neural network 810 are fed back into itself. In some cases, the neural network 810 can include a recurrent neural network, which can have loops that allow information to be carried across nodes while reading in input. In some cases, the neural network 810 can include an attention model that assigns weights or importance scores to different elements of any input sequence in order to selectively focus or pay attention to the most important parts of the input sequence and allow the neural network 810 to understand the relationships between different parts of the input.

Information can be exchanged between nodes through node-to-node interconnections between the various layers. Nodes of the input layer 820 can activate a set of nodes in the first hidden layer 822*a*. For example, as shown, each of the input nodes of the input layer 820 is connected to each of the nodes of the first hidden layer 822*a*. The nodes of the first hidden layer 822*a* can transform the information of each input node by applying activation functions to the input node information. The information derived from the transformation can then be passed to and can activate the nodes of the next hidden layer 822*b*, which can perform their own designated functions. Example functions include convolutional, up-sampling, data transformation, and/or any other suitable functions. The output of the hidden layer 822*b* can then activate nodes of the next hidden layer, and so on. The output of the last hidden layer 822*n* can activate one or more nodes of the output layer 821, at which an output is provided. In some cases, while nodes in the neural network 810 are shown as having multiple output lines, a node can have a single output and all lines shown as being output from a node represent the same output value.

In some cases, each node or interconnection between nodes can have a weight that is a set of parameters derived from the training of the neural network 810. Once the neural network 810 is trained, it can be referred to as a trained neural network, which can be used to generate one or more outputs. For example, an interconnection between nodes can represent a piece of information learned about the interconnected nodes. The interconnection can have a tunable numeric weight that can be tuned (e.g., based on a training dataset), allowing the neural network 810 to be adaptive to inputs and able to learn as more and more data is processed.

The neural network 810 can be pre-trained to process the features from the data in the input layer 820 using the different hidden layers 822A, 822B, through 822N in order to provide the output through the output layer 821. In some cases, the neural network 810 can adjust the weights of the nodes using a training process called backpropagation. A backpropagation process can include a forward pass, a loss function, a backward pass, and a weight update. The forward pass, loss function, backward pass, and parameter/weight update is performed for one training iteration. The process can be repeated for a certain number of iterations for each set of training data until the neural network 810 is trained well enough so that the weights of the layers are accurately tuned.

To perform training, a loss function can be used to analyze an error in the output. Any suitable loss function definition can be used, such as a Cross-Entropy loss. Another example of a loss function includes the mean squared error (MSE), defined as E_total=Σ(½(target−output)^2). The loss can be set to be equal to the value of E_total.

The loss (or error) will be high for the initial training data since the actual values will be much different than the predicted output. The goal of training is to minimize the amount of loss so that the predicted output is the same as the training output. The neural network 810 can perform a backward pass by determining which inputs (weights) most contributed to the loss of the network and can adjust the weights so that the loss decreases and is eventually minimized.

The neural network 810 can include any suitable deep learning architecture for implementing the machine learning models described herein. For example, the neural network 810 may include a multilayer perceptron (MLP), a convolutional neural network (CNN), a recurrent neural network (RNN), or a transformer-based model. In some configurations, the neural network 810 may implement an encoder-decoder structure, a variational autoencoder (VAE), or a feedforward regression model used for predicting coefficient vectors or reconstructing well log values. The architecture may be selected based on the input log structure, the dimensionality of the latent space, the training objectives, and the types of log channels being inferred. In some cases, the neural network 810 may incorporate attention mechanisms or context-aware encoding to improve performance on depth-aligned sequences or windowed input segments. As understood by those of ordinary skill in the art, machine learning models may be adapted and configured to support reconstruction accuracy, uncertainty quantification, interpretability, or cross-well generalization depending on implementation preferences.

Machine learning classification models can also be based on clustering algorithms (e.g., a Mini-batch K-means clustering algorithm), a recommendation algorithm (e.g., a Minwise Hashing algorithm, or Euclidean Locality-Sensitive Hashing (LSH) algorithm), and/or an anomaly detection algorithm, such as a local outlier factor. Additionally, machine-learning models can employ a dimensionality reduction approach, such as, one or more of: a Mini-batch Dictionary Learning algorithm, an incremental Principal Component Analysis (PCA) algorithm, a Latent Dirichlet Allocation algorithm, and/or a Mini-batch K-means algorithm, etc.

Figure 9:
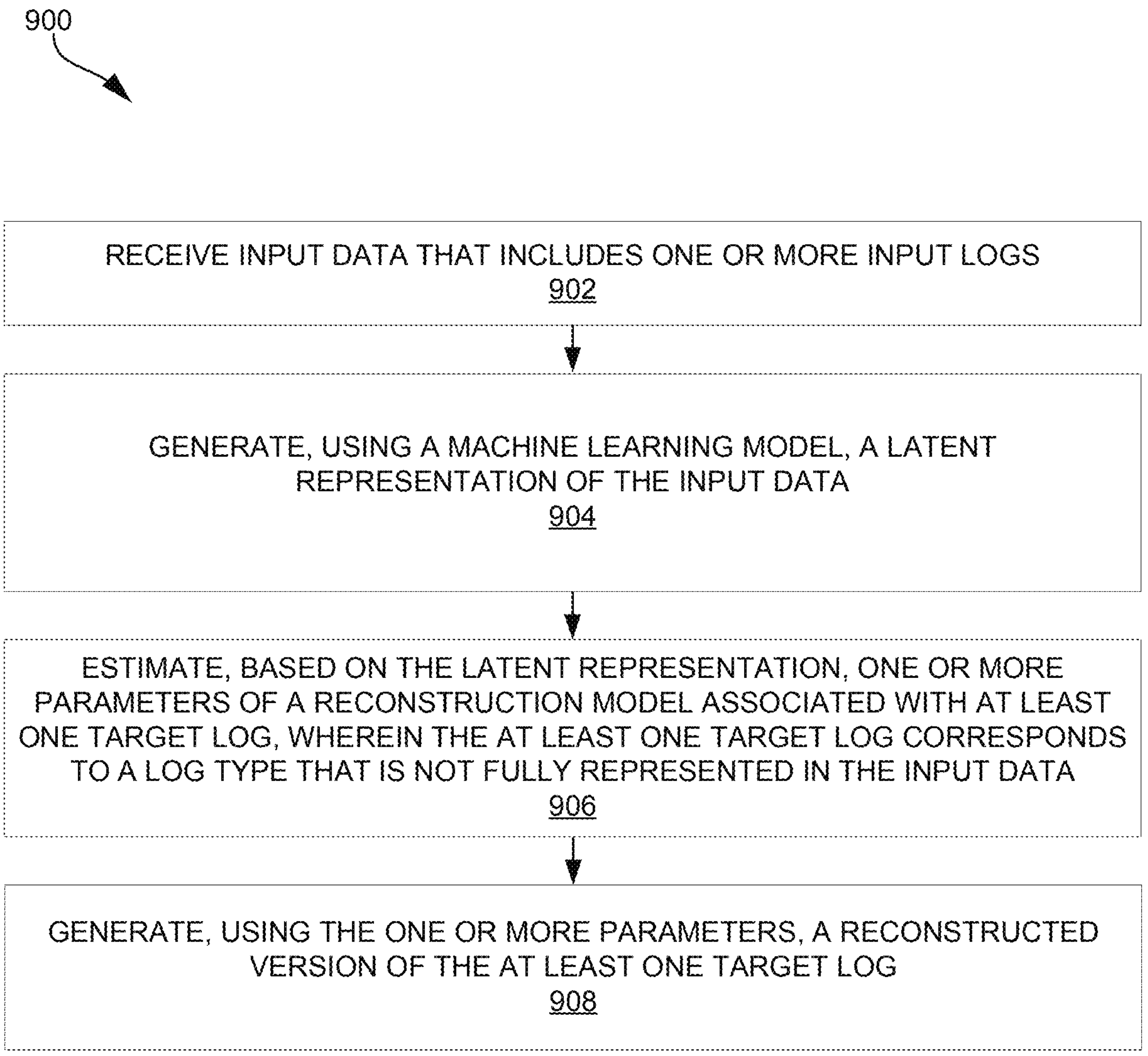
FIG. 9 is a flowchart of an example inference process for reconstructing a target log, according to some examples of the present disclosure.

FIG. 9 illustrates an example process 900 for reconstructing a target well log based on parameters inferred from a latent representation of input data. The process 900 may correspond to operations performed by the system 200 shown in FIG. 2 or the workflow 300 shown in FIG. 3. Although the steps are presented in a particular order, they may be executed in a different sequence or concurrently, depending on the implementation.

At block 902, the process includes receiving input data that includes one or more input logs. For example, the input data module 202 of FIG. 2 may receive gamma ray (GR), neutron porosity (NPHI), bulk density (RHOB), resistivity (RT), or other measurements from wireline or while-drilling tools. The input data may also include interpreted formation properties (e.g., lithofacies, porosity, or brittleness), synthetic logs, or augmented samples. In some cases, the input data may be organized as a depth-aligned matrix, windowed segments, or contextual log intervals.

At block 904, the process includes generating, using a machine learning model, a latent representation of the input data. For example, the feature encoder 204 in FIG. 2 or the encoder 404 in FIG. 4 may transform the input logs into a latent space representation that captures inter-log dependencies and geological context. In some configurations, the latent representation may be deterministic or may define a distribution (e.g., a Gaussian distribution parameterized by a mean and standard deviation, as in a VAE). The encoder may be implemented using convolutional layers, transformer-based set encoders, or other architectures suitable for depth-wise and contextual inference.

At block 906, the process includes estimating, based on the latent representation, one or more parameters of a reconstruction model associated with at least one target log. For example, the parameter inference module 208 in FIG. 2 or the ML model 304 in FIG. 3 may be configured to infer a vector of tunable parameters based on the latent representation. The reconstruction model may include a predefined petrophysical equation (e.g., a linear sonic model, Archie's equation, or another domain-specific model), a chained computation workflow, or a physics-based mapping. In some cases, the target log may correspond to a log type that is not fully represented in the input data, such as compressional slowness (DTC), shear slowness (DTS), formation factor, or water saturation. In some cases, the parameter inference model may be trained using a two-stage process as shown in FIG. 5, involving coefficient-level supervision followed by fine-tuning on output reconstruction loss.

In some configurations, the machine learning model used to estimate the parameters may include one or more neural network components such as a multilayer perceptron (MLP), a convolutional neural network (CNN), a transformer with self-attention, a recurrent neural network (RNN), a generative adversarial network (GAN), or a diffusion model. In other configurations, the machine learning model may include a gradient-boosted tree model (e.g., XGBoost) or other non-neural methods. The model may be configured to process individual input segments or entire wells, and may support attention pooling, depth-wise aggregation, or segment-based analysis.

At block 908, the process includes generating, using the one or more parameters, a reconstructed version of the at least one target log. For example, the reconstruction model engine 210 of FIG. 2 or the equation engine 306 of FIG. 3 may apply the inferred parameters in combination with selected log inputs to produce the reconstructed log. The selected inputs may include RHOB and NPHI in the case of sonic reconstruction, or alternative logs depending on the target equation. The reconstructed log may include DTC, DTS, RHOB, water saturation, porosity, or other derived properties. In some cases, the system may output not only reconstructed values but also uncertainty estimates, residuals, or confidence scores based on model calibration or ensemble sampling.

In some implementations, the reconstructed target log may be used as input to a downstream task such as facies classification, reservoir modeling, production forecasting, or rock property estimation. In some cases, the reconstructed log may be visualized alongside original logs for interpretation, or used to augment sparse datasets in data-driven workflows.

In some aspects, the system may support adaptive selection of the reconstruction model based on metadata, input log types, formation zone, or tool availability. Optional modules may include uncertainty-aware ranking, residual feedback, or dynamic equation selection from a predefined library. The process 900 thus enables parameter-based reconstruction of missing or unmeasured log channels in a way that is interpretable, modular, and consistent with domain-specific physics.

Figure 10:
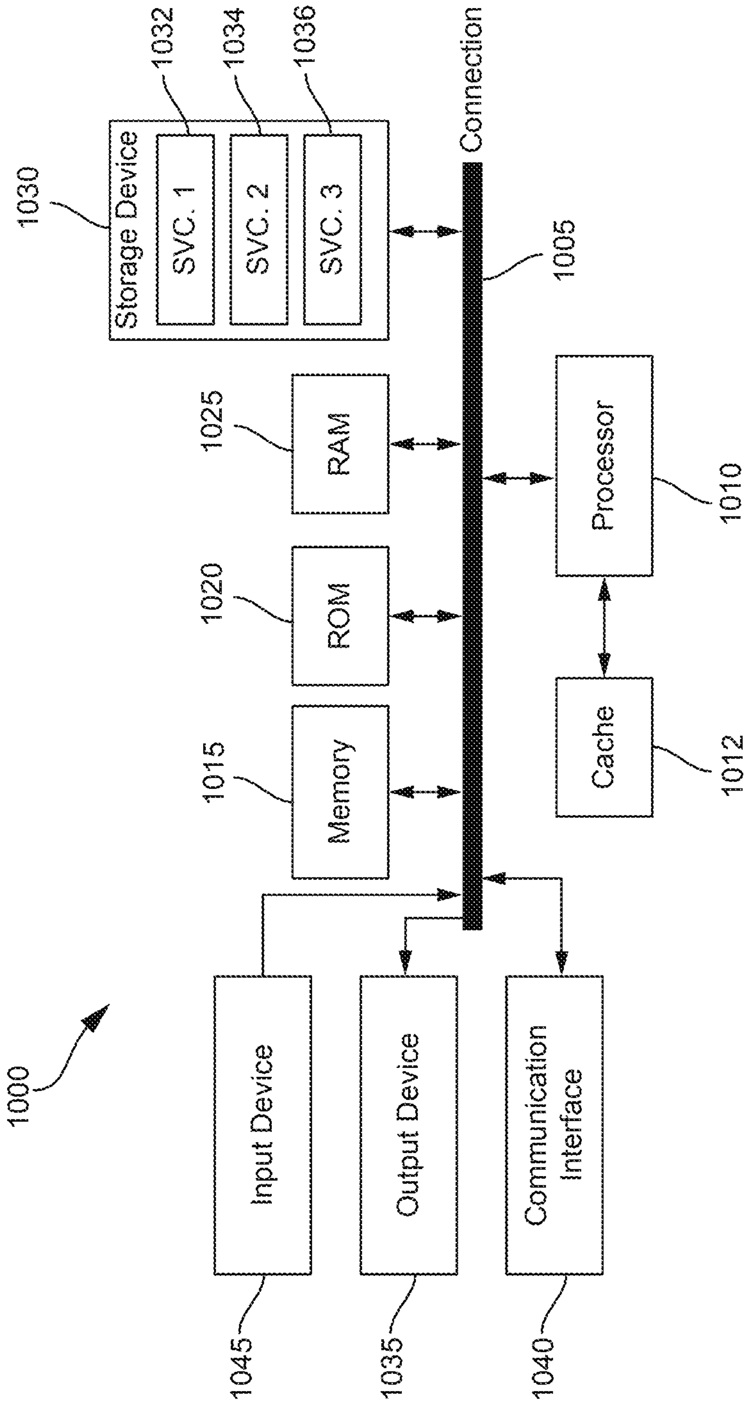
FIG. 10 illustrates an example computing device and hardware that can be used to implement some aspects of the disclosed technology.

FIG. 10 illustrates an example computing device architecture 1000 which can be employed to perform any of the systems and techniques described herein. In some examples, the computing device architecture 1000 can be integrated with any system described herein, such as the system 200, system 300, system 400, system 500, and/or any components thereof, and/or any other system. Further, the computing device can be configured to implement the techniques of generating one or more target logs, as described herein.

The components of the computing device architecture 1000 are shown in electrical communication with each other using a connection 1005, such as a bus. The example computing device architecture 1000 includes a processing unit (CPU or processor) 1010 and a computing device connection 1005 that couples various computing device components including the computing device memory 1015, such as read only memory (ROM) 1020 and random-access memory (RAM) 1025, to the processor 1010.

The computing device architecture 1000 can include a cache of high-speed memory connected directly with, in close proximity to, or integrated as part of the processor 1010. The computing device architecture 1000 can copy data from the memory 1015 and/or the storage device 1030 to the cache 1012 for quick access by the processor 1010. In this way, the cache can provide a performance boost that avoids processor 1010 delays while waiting for data. These and other modules can control or be configured to control the processor 1010 to perform various actions. Other computing device memory 1015 may be available for use as well. The memory 1015 can include multiple different types of memory with different performance characteristics. The processor 1010 can include any general-purpose processor and a hardware or software service, such as service 1 1032, service 2 1034, and service 3 1036 stored in storage device 1030, configured to control the processor 1010 as well as a special-purpose processor where software instructions are incorporated into the processor design. The processor 1010 may be a self-contained system, containing multiple cores or processors, a bus, memory controller, cache, etc. A multi-core processor may be symmetric or asymmetric.

To enable user interaction with the computing device architecture 1000, an input device 1045 can represent any number of input mechanisms, such as a microphone for speech, a touch-sensitive screen for gesture or graphical input, keyboard, mouse, motion input, speech and so forth. An output device 1035 can also be one or more of a number of output mechanisms known to those of skill in the art, such as a display, projector, television, speaker device, etc. In some instances, multimodal computing devices can enable a user to provide multiple types of input to communicate with the computing device architecture 1000. The communications interface 1040 can generally govern and manage the user input and computing device output. There is no restriction on operating on any particular hardware arrangement and therefore the basic features here may easily be substituted for improved hardware or firmware arrangements as they are developed.

Storage device 1030 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 1025, read only memory (ROM) 1020, and hybrids thereof. The storage device 1030 can include services 1032, 1034, 1036 for controlling the processor 1010. Other hardware or software modules are contemplated. The storage device 1030 can be connected to the computing device connection 1005. In one aspect, a hardware module that performs a particular function can include the software component stored in a computer-readable medium in connection with the necessary hardware components, such as the processor 1010, connection 1005, output device 1035, and so forth, to carry out the function.

For clarity of explanation, in some instances the present technology may be presented as including individual functional blocks including functional blocks comprising devices, device components, steps or routines in a method implemented in software, or combinations of hardware and software.

In some instances, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can include, for example, instructions and data which cause or otherwise configure a general purpose computer, special purpose computer, or a processing device to perform a certain function or group of functions. Portions of computer resources used can be accessible over a network. The computer executable instructions may be, for example, binaries, intermediate format instructions such as assembly language, firmware, source code, etc. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can include hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are example means for providing the functions described in the disclosure.

In the foregoing description, aspects of the application are described with reference to specific examples and aspects thereof, but those skilled in the art will recognize that the application is not limited thereto. Thus, while illustrative examples and aspects of the application have been described in detail herein, it is to be understood that the disclosed concepts may be otherwise variously embodied and employed, and that the appended claims are intended to be construed to include such variations, except as limited by the prior art. Various features and aspects of the above-described subject matter may be used individually or jointly. Further, examples and aspects of the systems and techniques described herein can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate examples, the methods may be performed in a different order than that described.

Where components are described as being "configured to" perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

The various illustrative logical blocks, modules, circuits, and algorithm steps described in connection with the examples disclosed herein may be implemented as electronic hardware, computer software, firmware, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present application.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the method, algorithms, and/or operations described above. The computer-readable data storage medium may form part of a computer program product, which may include packaging materials.

The computer-readable medium may include memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

Methods and apparatus of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Such methods may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

In the above description, terms such as "upper," "upward," "lower," "downward," "above," "below," "downhole," "uphole," "longitudinal," "lateral," and the like, as used herein, shall mean in relation to the bottom or furthest extent of the surrounding wellbore even though the wellbore or portions of it may be deviated or horizontal. Correspondingly, the transverse, axial, lateral, longitudinal, radial, etc., orientations shall mean orientations relative to the orientation of the wellbore or tool.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or another word that substantially modifies, such that the component need not be exact. For example, substantially cylindrical means that the object resembles a cylinder, but can have one or more deviations from a true cylinder.

The term "radially" means substantially in a direction along a radius of the object, or having a directional component in a direction along a radius of the object, even if the object is not exactly circular or cylindrical. The term "axially" means substantially along a direction of the axis of the object. If not specified, the term axially is such that it refers to the longer axis of the object.

Although a variety of information was used to explain aspects within the scope of the appended claims, no limitation of the claims should be implied based on particular features or arrangements, as one of ordinary skill would be able to derive a wide variety of implementations. Further and although some subject matter may have been described in language specific to structural features and/or method steps, it is to be understood that the subject matter defined in the appended claims is not necessarily limited to these described features or acts. Such functionality can be distributed differently or performed in components other than those identified herein. The described features and steps are disclosed as possible components of systems and methods within the scope of the appended claims.

Claim language or other language in the disclosure reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

Illustrative examples of the disclosure include:

Aspect 1. A system comprising: at least one memory; and one or more processors coupled to the at least one memory, the one or more processors configured to: receive input data that includes one or more input logs; generate, using a machine learning model, a latent representation of the input data; estimate, based on the latent representation, one or more parameters of a reconstruction model associated with at least one target log, wherein the at least one target log corresponds to a log type that is not fully represented in the input data; and generate, using the one or more parameters, a reconstructed version of the at least one target log.

Aspect 2. The system of Aspect 1, wherein the reconstruction model comprises a parameterized reconstruction function, and wherein the one or more parameters comprise coefficients used to evaluate the parameterized reconstruction function based on at least one of the one or more input logs.

Aspect 3. The system of any of Aspects 1 to 2, wherein the latent representation is generated using at least one of a variational autoencoder (VAE), a transformer network, a recurrent neural network (RNN), a convolutional neural network (CNN), a generative adversarial network (GAN), and a diffusion-based generative model.

Aspect 4. The system of any of Aspects 1 to 3, wherein to estimate the one or more parameters the one or more processors are configured to: produce, using a parameter inference module, an input-dependent sequence of parameter values.

Aspect 5. The system of any of Aspects 1 to 4, wherein to generate the reconstructed version of the at least one target log the one or more processors are configured to: evaluate the reconstruction model using the one or more parameters and at least one input log from among the one or more input logs.

Aspect 6. The system of any of Aspects 1 to 5, wherein the one or more input logs include at least one of a wireline log, a logging-while-drilling (LWD) log, a drilling-derived measurement, an image log, an interpreted formation property, a synthetic log, and an augmented data sample.

Aspect 7. The system of any of Aspects ito 6, wherein the one or more processors are configured to: train the machine learning model using a loss function that includes a reconstruction loss between the reconstructed version of the target log and a reference log value.

Aspect 8. The system of any of Aspects 1 to 7, wherein the one or more parameters are estimated using a machine learning model that receives the latent representation of the input data and generates the one or more parameters, wherein the machine learning model includes at least one of a multilayer perceptron (MLP), a convolutional neural network (CNN), a transformer with self-attention, a generative adversarial network (GAN), a diffusion model, and a gradient-boosted tree model.

Aspect 9. The system of any of Aspects 1 to 8, wherein the reconstructed version of the target log comprises an imputed well log corresponding to a petrophysical measurement.

Aspect 10. The system of any of Aspects 1 to 9, wherein the reconstructed version of the target log represents a derived formation property, wherein the derived formation property includes at least one of porosity, saturation, brittleness, and lithofacies.

Aspect 11. The system of any of Aspects 1 to 10, wherein the reconstructed version of the target log is provided as input to a downstream workflow comprising at least one of facies classification, reservoir modeling, and production forecasting.

Aspect 12. A method comprising: receiving input data that includes one or more input logs; generating, using a machine learning model, a latent representation of the input data; estimating, based on the latent representation, one or more parameters of a reconstruction model associated with at least one target log, wherein the at least one target log corresponds to a log type that is not fully represented in the input data; and generating, using the one or more parameters, a reconstructed version of the at least one target log.

Aspect 13. The method of Aspect 12, wherein the reconstruction model comprises a parameterized reconstruction function, and wherein the one or more parameters comprise coefficients used to evaluate the parameterized reconstruction function based on at least one of the one or more input logs.

Aspect 14. The method of any of Aspects 12 to 13, wherein the latent representation is generated using at least one of a variational autoencoder (VAE), a transformer network, a recurrent neural network (RNN), a convolutional neural network (CNN), a generative adversarial network (GAN), and a diffusion-based generative model.

Aspect 15. The method of any of Aspects 12 to 14, wherein estimating the one or more parameters further comprises: producing, using a parameter inference module, an input-dependent sequence of parameter values.

Aspect 16. The method of any of Aspects 12 to 15, wherein generating the reconstructed version of the at least one target log further comprises: evaluating the reconstruction model using the one or more parameters and at least one input log from among the one or more input logs.

Aspect 17. The method of any of Aspects 12 to 16, wherein the one or more parameters are estimated using a machine learning model that receives the latent representation of the input data and generates the one or more parameters, wherein the machine learning model includes at least one of a multilayer perceptron (MLP), a convolutional neural network (CNN), a transformer with self-attention, a generative adversarial network (GAN), a diffusion model, and a gradient-boosted tree model.

Aspect 18. The method of any of Aspects 12 to 17, wherein the reconstructed version of the target log comprises an imputed well log corresponding to a petrophysical measurement.

Aspect 19. The method of any of Aspects 12 to 18, wherein the reconstructed version of the target log represents a derived formation property, wherein the derived formation property includes at least one of porosity, saturation, brittleness, and lithofacies.

Aspect 20. The method of any of Aspects 12 to 19, wherein the one or more input logs include at least one of a wireline log, a logging-while-drilling (LWD) log, a drilling-derived measurement, an image log, an interpreted formation property, a synthetic log, and an augmented data sample.

Aspect 21. The method of any of Aspects 12 to 20, further comprising: training the machine learning model using a loss function that includes a reconstruction loss between the reconstructed version of the target log and a reference log value.

Aspect 22. The method of any of Aspects 12 to 21, wherein the reconstructed version of the target log is provided as input to a downstream workflow comprising at least one of facies classification, reservoir modeling, and production forecasting.

Aspect 23. A non-transitory computer-readable medium having instructions stored thereon that, when executed by one or more processors, cause the one or more processors to perform a method according to any of Aspects 12 to 22.

Aspect 24. A system comprising means for performing a method according to any of Aspects 12 to 22.

What is claimed is:

1. A system comprising:

at least one memory; and one or more processors coupled to the at least one memory, the one or more processors configured to:

receive input data that includes one or more input logs;

train a machine learning model using a loss function that includes a reconstruction loss between a predicted reconstructed version of a target log and a reference log value;

generate, using the machine learning model, a latent representation of the input data;

estimate, based on the latent representation, one or more parameter values of a reconstruction model that is distinct from the machine learning model and is associated with at least one target log, wherein the at least one target log corresponds to a log type that is not fully represented in the input data;

provide the one or more parameter values as inputs to the reconstruction model; and generate a reconstructed version of the at least one target log by evaluating the reconstruction model using the one or more parameter values and at least one input log from among the one or more input logs.

2. The system of claim 1, wherein the reconstruction model comprises a parameterized reconstruction function, and wherein the one or more parameter values comprise coefficients used to evaluate the parameterized reconstruction function.

3. The system of claim 1, wherein the latent representation is generated using at least one of a variational autoencoder (VAE), a transformer network, a recurrent neural network (RNN), a convolutional neural network (CNN), a generative adversarial network (GAN), and a diffusion-based generative model.

4. The system of claim 1, wherein to estimate the one or more parameter values the one or more processors are configured to:

produce, using a parameter inference module, an input-dependent sequence of parameter values.

5. The system of claim 1, wherein the one or more input logs include at least one of a wireline log, a logging-while-drilling (LWD) log, a drilling-derived measurement, an image log, an interpreted formation property, a synthetic log, and an augmented data sample.

6. The system of claim 1, wherein the one or more parameter values are estimated using a machine learning model that receives the latent representation of the input data and generates the one or more parameter values, wherein the machine learning model includes at least one of a multilayer perceptron (MLP), a convolutional neural network (CNN), a transformer with self-attention, a generative adversarial network (GAN), a diffusion model, and a gradient-boosted tree model.

7. The system of claim 1, wherein the reconstructed version of the target log comprises an imputed well log corresponding to a petrophysical measurement.

8. The system of claim 1, wherein the reconstructed version of the target log represents a derived formation property, wherein the derived formation property includes at least one of porosity, saturation, brittleness, and lithofacies.

9. The system of claim 1, wherein the reconstructed version of the target log is provided as input to a downstream workflow comprising at least one of facies classification, reservoir modeling, and production forecasting.

10. A method comprising:

receiving input data that includes one or more input logs;

training a machine learning model using a loss function that includes a reconstruction loss between a predicted reconstructed version of a target log and a reference log value;

generating, using the machine learning model, a latent representation of the input data;

estimating, based on the latent representation, one or more parameter values of a reconstruction model that is distinct from the machine learning model and is associated with at least one target log, wherein the at least one target log corresponds to a log type that is not fully represented in the input data;

providing the one or more parameter values as inputs to the reconstruction model; and generating a reconstructed version of the at least one target log by evaluating the reconstruction model using the one or more parameter values and at least one input log from among the one or more input logs.

11. The method of claim 10, wherein the reconstruction model comprises a parameterized reconstruction function, and wherein the one or more parameter values comprise coefficients used to evaluate the parameterized reconstruction function.

12. The method of claim 10, wherein the latent representation is generated using at least one of a variational autoencoder (VAE), a transformer network, a recurrent neural network (RNN), a convolutional neural network (CNN), a generative adversarial network (GAN), and a diffusion-based generative model.

13. The method of claim 10, wherein estimating the one or more parameter values further comprises:

producing, using a parameter inference module, an input-dependent sequence of parameter values.

14. The method of claim 10, wherein the one or more parameter values are estimated using a machine learning model that receives the latent representation of the input data and generates the one or more parameter values, wherein the machine learning model includes at least one of a multilayer perceptron (MLP), a convolutional neural network (CNN), a transformer with self-attention, a generative adversarial network (GAN), a diffusion model, and a gradient-boosted tree model.

15. The method of claim 10, wherein the reconstructed version of the target log comprises an imputed well log corresponding to a petrophysical measurement.

16. The method of claim 10, wherein the reconstructed version of the target log represents a derived formation property, wherein the derived formation property includes at least one of porosity, saturation, brittleness, and lithofacies.

17. A non-transitory computer-readable storage medium having stored thereon instructions which, when executed by one or more processors, cause the one or more processors to:

receive input data that includes one or more input logs;

train a machine learning model using a loss function that includes a reconstruction loss between a predicted reconstructed version of a target log and a reference log value;

generate, using the machine learning model, a latent representation of the input data;

estimate, based on the latent representation, one or more parameter values of a reconstruction model that is distinct from the machine learning model and is associated with at least one target log, wherein the at least one target log corresponds to a log type that is not fully represented in the input data;

provide the one or more parameter values as inputs to the reconstruction model; and generate a reconstructed version of the at least one target log by evaluating the reconstruction model using the one or more parameter values and at least one input log from among the one or more input logs.

* * * * *